United States Patent

Voinigescu et al.

[11] Patent Number: 6,002,860
[45] Date of Patent: Dec. 14, 1999

[54] HIGH FREQUENCY NOISE AND IMPEDANCE MATCHED INTEGRATED CIRCUITS

[75] Inventors: Sorin P. Voinigescu, Kanata; Michael C. Maliepaard, Stittsville, both of Canada

[73] Assignee: Nortel Networks Corporation, Montreal, Canada

[21] Appl. No.: 09/086,798

[22] Filed: May 29, 1998

Related U.S. Application Data

[62] Division of application No. 08/727,367, Sep. 27, 1996, Pat. No. 5,789,799.
[51] Int. Cl.$^6$ .................. H01L 27/082; G06F 7/625; G06F 7/62
[52] U.S. Cl. ............................................. 395/500.35
[58] Field of Search ................. 395/500.02; 326/119; 257/7, 272

[56] References Cited

U.S. PATENT DOCUMENTS

| | | | |
|---|---|---|---|
| 4,390,851 | 6/1983 | Higgins et al. | 330/277 |
| 4,525,678 | 6/1985 | Lehmann et al. | 330/277 |
| 4,843,440 | 6/1989 | Huang | 257/256 |
| 4,890,069 | 12/1989 | Duffalo et al. | 330/277 |
| 4,929,986 | 5/1990 | Yoder | 257/275 |
| 5,352,994 | 10/1994 | Black et al. | 333/33 |
| 5,445,985 | 8/1995 | Calviello et al. | 438/171 |

OTHER PUBLICATIONS

K.K. Ko et al, "A comparative study on the various monolithic low noise amplifier circuit topologies for RF and microwave Applications" IEEE J. Solid State Circuits vol. 31, No. 8, Aug. 1996, pp. 1220–1225.

F. McGrath et al, in "A 1.9GHz GaAs Chip set for the personal handyphone system", IEEE Trans. MTT vol. 43, pp. 1773–1744.

A. Brunel, et al in "A Downconverter for use in a dual mode AMPS/CDMA chip set", in Microwave J., pp. 20–42, Feb. 1996.

S. Voinigescu, et al "A scaleable high frequency noise model for bipolar transistors with application to optimal transistor sizing for Low noise amplifier design" to be published at the Bipolar Circuits and Technology Meeting, Sep. 30, 1996.

*Primary Examiner*—Kevin J. Teska
*Assistant Examiner*—Hugh Jones
*Attorney, Agent, or Firm*—Angela C. de Wilton

[57] ABSTRACT

An monolithic integrated circuit comprising a transistor-inductor structure is provided having simultaneously noise matched and input impedance matched characteristics at a desired frequency. The transistor-inductor structure comprises a first transistor $Q_1$ which may be a common emitter bipolar transistor or common source MOSFET transistor $Q_1$, a second optional transistor $Q_2$, a first inductor $L_E$ in the emitter (source) of $Q_1$, and a second inductor $L_B$ in the base (gate) of Q1. The emitter length $l_{E1}$, or correspondingly the gate width $w_g$, of Q1 is designed such that the real part of its optimum noise impedance is equal to the characteristic impedance of the system, $Z_0$, which is typically 50Ω. The first inductor $L_E$, provides matching of the real part of the input impedance and the second inductor $L_B$ cancels out the noise reactance and input impedance reactance of the structure. The resulting simultaneously noise and impedance matched integrated circuit provides optimal performance. The optimized transistor-inductor structure has particular application to silicon integrated circuits, such as low noise amplifiers and mixer circuits, for wireless and RF circuit applications at 5.8 Ghz, previously reported only for GaAs based circuits. Other basic silicon integrated circuits were optimized at frequencies up to ~12 GHz.

9 Claims, 15 Drawing Sheets

Ideal inductor only affects $X_{sop}$, but not $R_{sop}$

HIGH FREQUENCY NOISE AND IMPEDANCE MATCHED INTEGRATED CIRCUITS

This is a divisional of prior application Ser. No. 08/727,367, filed Sep. 27, 1996, now U.S. Pat. No. 5,789,799.

FIELD OF THE INVENTION

This invention relates to high frequency noise and impedance matched integrated circuits and a methodology for circuit design, with particular application to silicon integrated circuits using integrated inductors for RF circuit applications.

BACKGROUND OF THE INVENTION

Successful exploitation of wireless consumer products relies on highly integrated, low cost integrated circuits. Steady improvements in transistor performance and demand for higher levels of integration have led to the increased application of silicon technology for RF and wireless circuit applications. Indeed, cost effective silicon-based integrated circuits are now available for wireless personal communications systems at lower bit rates in the ~1 GHz band.

Recent developments in broadband multimedia communications systems are based on wireless asynchronous transfer mode (ATM) transmission in the 5 GHz band. Although GaAs circuits remain several times more expensive than silicon circuits, the feasibility of using lower cost silicon based technology in this frequency band has been limited, due to significantly higher substrate and interconnect losses in silicon relative to GaAs. Historically, silicon technology has suffered from a lack of high Q inductors. More recently, improved inductor performance has been obtained using microstrip transmission line inductors.

Nevertheless, whether designing high frequency GaAs or silicon based circuits, for example, tuned low noise amplifier (LNA) and mixer circuits for wireless systems, simultaneous noise and impedance matching presents a challenge to improved performance. There is a trade-off in noise and input impedance matching, as discussed by K. K. Ko et al, "A comparative study on the various monolithic low noise amplifier circuit topologies for RF and microwave Applications" IEEE J. Solid State Circuits vol. 31, no. 8, August 1996, pp. 1220–1225. This trade-off is caused mostly by the fact that the transistor size is traditionally considered as a fixed design parameter, and a library of certain standards sizes are available. Thus, conventionally, a passive network is designed around a given transistor in order to achieve noise matching and/or impedance matching. The passive network itself contributes losses and degrades the noise figure, as discussed by F. McGrath et al, in "A 1.9 GHz GaAs Chip set for the personal handyphone system", IEEE Trans. MTT Vol. 43, pp. 1733–1744, 1995 and by A. Brunel, et al. in "A Downconverter for use in a dual mode AMPS/CDMA chip set", in Microwave J., pp. 20–42, February 1996.

The losses in the passive network increase as the network become more complicated, and a significant area of an integrated circuit may be taken up by the matching network. For example, in typical low noise amplifiers and GaAs mixer circuits discussed in the above mentioned references to Ko, McGrath and Brunel, either the noise figure or input impedance matching are sub-optimal, or the passive matching circuit is excessively complex, occupying a large semiconductor area.

It is well known that high frequency losses are particularly severe on semiconducting silicon substrates, relative to semi-insulating GaAs substrates. On the other hand, while passive components are less lossy on GaAs substrates, the present cost of GaAs circuits is at least a factor of two more expensive than silicon circuits. Consequently, if matching losses were reduced for silicon substrates to allow for design of high performance wireless circuits, these circuits could be fabricated in silicon with significant cost savings relative to similar GaAs circuits.

SUMMARY OF THE INVENTION

The present invention seeks to provide improved noise and impedance matching for monolithic integrated circuits, particularly for silicon integrated circuits for high frequency applications in RF and wireless technology, and a design methodology for integrated circuits, which overcomes or avoids the above mentioned limitations.

Thus according to one aspect of the present invention there is provided an integrated circuit including an integrated transistor-inductor structure comprising:

a transistor having geometric dimensions comprising a characteristic dimension, the characteristic dimension being an emitter length, $l_E$ for a bipolar transistor, and a gate width $w_g$ for field effect transistor, the characteristic dimension being selected to provide the real part of the optimum noise impedance equal to the characteristic impedance of the integrated circuit $Z_0$, thereby providing noise matching of the transistor at a selected operating frequency and bias current density;

and a passive matching network consisting of a first inductor for matching the real part of the input impedance to $Z_0$, and a second inductor for cancelling out the imaginary part of the input impedance and the noise reactance respectively, the circuit thereby providing simultaneous noise and input impedance matching.

Optimization of the transistor geometry achieves noise matching of the transistor and reduces the number of network matching components required to meet impedance and noise specifications of the circuit, and thus significantly reduces the circuit area. The noise and impedance matched integrated circuit structure comprising an optimised integrated-transistor-inductor structure provides improved performance at high frequencies suitable for RF and wireless circuit applications such as telecommunications.

The first inductor is selected to provide matching of the real part of the input impedance and is approximated by $L_E = Z_0/\omega_T$. The second inductor matches the imaginary part of the input impedance and the noise impedance to 0Ω by setting $L_B = 1/\omega^2 C_{in} - L_E$.

Typically the characteristic impedance of the system $Z_0$ is 50Ω. $Z_0$ may be increased from the typical 50Ω, if required, in order to improve performance further.

Where the integrated circuit comprises a bipolar transistor comprising an emitter, base and collector, coupled in common emitter configuration, the length $l_E$ of the emitter is optimized to provide noise matching of the transistor, and the first inductor is an emitter coupled inductor $L_E$ for matching the real part of the input impedance $Z_0$, and the second inductor is a base coupled inductor $L_B$ for matching the imaginary part of the input impedance and noise reactance to 0Ω.

Alternatively, when the transistor comprises a field effect transistor comprising a gate, source and drain, coupled in common source configuration, the width $w_G$ of the gate is optimized to provide noise matching of the transistor, and the first inductor is a source coupled inductor $L_E$ for matching the real part of the input impedance $Z_0$, and the second inductor is a gate coupled inductor $L_B$ for matching the imaginary part of the input impedance and noise reactance to 0Ω.

Practically, a second transistor Q2 is added for input/output buffering, the second transistor being coupled to the first transistor in cascode configuration, and size ratio of Q1 to Q2 being determined by the ratio of the peak $f_T$ current density and the minimum noise current density.

Thus according to another aspect of the present invention, there is provided an integrated circuit including an integrated transistor-inductor structure comprising:

first and second bipolar transistors in cascode configuration, each transistor comprising an emitter, collector and base, the first transistor being coupled in common emitter mode and the second transistor coupled in common base mode, the first transistor having a emitter length $l_E$, selected to provide to provide the real part of the optimum noise impedance equal to the characteristic impedance of the integrated circuit $Z_0$, thereby providing noise matching of the transistor at a selected operating frequency;

a first inductor $L_E$ coupled to the emitter of the first transistor, for matching the real part of the input impedance to $Z_0$, and a second inductor $L_B$, coupled to the base of the first transistor, for cancelling out the imaginary part of the input impedance and the noise reactance respectively, the circuit thereby providing simultaneous noise and input impedance matching.

The emitter length $l_{E2}$ of the second transistor is selected to provide that it is biased at the current density at which its cutoff frequency reaches a maximum for maximizing gain and frequency of operation. The size ratio, i.e. the ratio of the emitter lengths, of the first and second transistors is determined by the ratio of the peak $f_T$ current density to the minimum noise current density.

The design of the transistor-inductor structure is based on a novel approach to design methodology in which the size of the transistor is designed first so that real part of the optimum noise impedance of the transistor is noise matched to the characteristic impedance of the system $Z_0$, typically 50Ω, at the desired frequency and collector current density. Since the transistor is an active device, noise matching is achieved without losses and without noise figure degradation. The task of noise matching of the transistor is thus removed from the passive network. Losses in the passive network around the transistor are reduced, and the resulting matching network is therefore simpler, and less lossy than in current known circuit designs.

To complete the noise and impedance matched structure, a minimal passive network comprising only two lossless inductors is designed to provide impedance matching with the lowest possible degradation of the overall noise figure. The simplified matching network reduces components and saves area, contributing to significant cost reduction.

The noise and impedance matched transistor-inductor structure may be used to build integrated circuits such as low noise amplifiers and mixer circuits with significantly improved performance at high frequencies. Performance of noise and impedance matched silicon transistor-inductor devices has been obtained which is comparable to that of GaAs at frequencies in the 1 to 12 GHz range.

For example, the noise matched transistor-inductor structure may provide a circuit operable as a low noise amplifier, comprising: means for supplying a first input signal coupled to the first transistor base through the second inductor $L_{B2}$; the transistor emitter coupled to an emitter degeneration means comprising the first inductor $L_E$; and output means coupled to the collector of the first transistor for generating an output signal.

Correspondingly, the transistor-inductor structure may be used to provide a circuit operable as a mixer, comprising: means for supplying an first input (RF) signal coupled to the first transistor base through the second inductor $L_B$; a second base inductor coupled to the base of the second transistor and means for supplying a second input (LO) signal coupled to the second transistor through the second base inductor; the transistor emitter coupled to an emitter degeneration means comprising the first inductor $L_E$, for generating an output (IF) signal at output means coupled to the collector of the first transistor.

Each transistor may, for example, be a bipolar transistor selected from the group consisting bipolar junction transistors (BJTs) or heterojunction bipolar transistors (HBTs). Alternatively, the transistors may be field effect transistors, i.e. silicon MOSFETs or MESFETs, JFETs, and HEMT transistors. Thus the noise and impedance matched circuits may be implemented, for example, in silicon, silicon germanium, or a III–V compound semiconductor. By providing simultaneous noise and impedance matching, thereby reducing substrate losses, the design methodology provides for particular improvements in the high frequency performance of silicon based circuits.

The simple and compact integrated transistor-inductor structure is used to demonstrate the feasibility of fabricating a cost effective, high performance, high speed silicon integrated circuit, which is simultaneously noise and impedance matched.

According to a further aspect of the present invention there is provided a silicon integrated circuit structure comprising a integrated transistor-inductor structure for operation as a double balanced mixer comprising:

an input pair of common emitter transistors Q1 and Q2, a mixing quad comprising two differential pairs of common base transistors Q3 and Q4, and Q5 and Q6, each transistor of the input pair Q1 and Q1' coupled to the emitter of a respective one of the pairs of mixing quad;

a pair of emitter inductors $L_E$ coupled to the emitters of the input pair Q1 and Q2, the emitter inductors $L_E$ providing emitter degeneration means, and a base inductor $L_B$ coupled to the base of one of first pair of Q1 and Q2, the other base being AC grounded;

input means for supplying differential input (RF) signals coupled to the bases of the input transistor pair through the second inductor $L_B$, input means for supplying differential second input (LO) signals coupled to respective bases of each pair of transistors of the mixing quad, output means coupled to collectors of pairs transistors of the mixing quad for generating a differential output IF signal; and each of the transistors of the input pair Q1 and Q2 having a emitter length $l_E$, selected to provide the real part of the optimum noise impedance equal to the characteristic impedance of the integrated circuit $Z_0$, thereby providing noise matching of the transistors at a selected operating frequency;

the emitter inductors $L_E$ coupled to the emitter of the input transistors, for matching the real part of the input impedance to $Z_0$, and the second inductor $L_B$, coupled to the base of one of the input transistor, for cancelling out the imaginary part of the input impedance and the noise reactance respectively, the circuit thereby providing simultaneous noise and input impedance matching.

The size ratio of the transistors in the mixing quad and the input pair is based on ratio of the peak $f_T$ current density and the minimum noise current density.

Advantageously, the circuit includes an LO reject filter comprising an series LC filter coupled between the differential IF outputs, and a parallel LC resonator tuned on the second RF harmonic as an AC current source coupled in the emitter of the input pair.

According to another aspect of the present invention there is provided a silicon integrated circuit structure comprising a transistor-inductor structure for operation as a low noise differential amplifier, comprising:

an input pair of common emitter transistors Q1 and Q2, and an output pair of common base transistors Q3 and Q4 coupled in cascode configuration; a pair of emitter inductors $L_E$ coupled to respective emitters of the input pair Q1 and Q2, and a pair of base inductors $L_B$ coupled to the respective bases of the input pair of Q1 and Q2, means for supplying a first input signal pairs coupled to respectively to the bases of the first transistor pair through the second inductors $L_B$, for generating a pair of output signals at the collectors of the second transistors Q3 and Q4;

each of the transistors of the input pair Q1 and Q2 having a emitter length $l_E$, selected to provide the real part of the optimum noise impedance equal to the characteristic impedance of the integrated circuit $Z_0$, thereby providing noise matching of the transistors at a selected operating frequency;

the emitter inductors $L_E$ coupled to the emitter of the input transistors, for matching the real part of the input impedance to $Z_0$, and the base inductor $L_B$, coupled to the base of one of the input transistors, for cancelling out the imaginary part of the input impedance and the noise reactance respectively, the circuit thereby providing simultaneous noise and input impedance matching.

The emitter lengths of the first and second pairs of transistors are characterized by being twice as large as the corresponding emitter lengths in the corresponding single ended circuit.

Thus, the integrated transistor-inductor structure may be used to advantage in providing various input impedance and noise matched low noise amplifier circuit and a mixer circuit of simple and compact design. In particular, the circuits may be implemented in silicon, and provide high frequency performance more generally found only in GaAs circuits. These structures may be fabricated by known silicon process technology, and implemented in either high speed silicon bipolar or silicon MOSFET technologies. Other high speed silicon based devices, for example SiGe bipolar transistors may alternatively be used.

Specifically, monolithic silicon low noise amplifier and a mixer circuits operable at 5.8 GHz are demonstrated to be feasible with performance characteristics previously reported only for GaAs based circuits. This improved performance at a record high frequency for a silicon based circuit is dependent on several factors. Firstly, the unconventional design methodology presented herein, in which the transistor emitter length is treated as a design variable. Initially, the transistor emitter length is optimised to obtain noise matching, which then allows a very much simplified matching network. Secondly, the use of a high performance silicon bipolar technology takes advantage of recent improvements in inductors and microstrip transmission lines using multilevel metallization schemes. The latter benefit from use of first level metal as ground planes to reduce substrate losses.

Consequently, substrate losses can be reduced, and very significant improvements in performance of silicon based integrated circuits relative to conventional designs can be achieved for high frequency RF circuit applications.

Since the substrate losses in GaAs and other compound semiconductor implementations are lower than in silicon, more modest performance improvements are obtained. Nevertheless, the structure is also beneficial in avoiding the trade-off in noise and input impedance matching in designing GaAs and other III–V compound semiconductors to obtain optimal performance. Accordingly, another aspect of the present invention provides a method for providing a noise and impedance matched integrated circuit comprising an integrated transistor-inductor structure, comprising:

first, determining geometric dimensions of the transistor to provide the real part of the noise impedance of the transistor is equal to the characteristic impedance $Z_0$ at a desired frequency and collector current density;

and then, designing a minimal passive matching circuit comprising a first inductor to provide matching of the real part of the input impedance, and a second inductor cancelling out the noise reactance and input impedance reactance of the structure.

The design is achieved in two stages, I) the noise matched transistor design stage, which optimises noise matching at a selected frequency, and II) the circuit design stage in which simultaneous impedance and noise matching is pursued.

That is, transistor has a characteristic dimension, the characteristic dimension being an emitter length $l_E$ for a bipolar transistor and a gate width $w_g$ for field effect transistor, which is designed to provide that the real part of its optimum noise impedance is equal to the characteristic impedance of the system, $Z_0$.

The first stage is dependent on the availability of scalable models, which have not until recently been available in the literature. Indeed, the design approach requires a physically based scalable model for bipolar transistors, and accurate closed-form noise parameter equations suitable for circuit design. Designing a minimal passive impedance matching circuit comprising first and second inductors, comprises determining the inductance of an emitter inductor $L_E$ to match the real part of the input impedance to $Z_0$, and then, determining the inductance of a base inductor $L_B$ to simultaneously match the imaginary part of the input impedance and the noise impedance to $0\Omega$.

This design approach is unique in treating the transistor geometry as a design variable. In particular, a characteristic dimension of the transistor, i.e. the emitter length of a bipolar transistor, or the gate width of a field effect transistor is optimised to achieve noise matching of the transistor. The design methodology allows for simultaneous optimization of both the transistor parameters and the passive matching network component parameters.

The steps of stage I, i.e. designing a noise matched transistor comprise: determining an optimal noise current density $J_{Q1}$ according to equations.

$$F_{\text{MIN}} = 1 + \frac{I_C}{V_T |Y_{21}|^2} \left( \text{Re}\{Y_{11}\} + \sqrt{\left[1 + \frac{2V_T |Y_{21}|^2 (r_E + r_B)}{I_C}\right] \left[|Y_{11}|^2 + \frac{I_B |Y_{21}|^2}{I_C}\right] - (\text{Im}\{Y_{11}\})^2} \right) \quad (1)$$

-continued $$R_{sop} \cong \frac{R_n f_T}{f} \frac{\sqrt{\frac{I_C}{2V_T}(r_E + r_B)\left(1 + \frac{f_T^2}{\beta_0 f^2}\right) + \frac{n^2 f_T^2}{4\beta_0 f^2}}}{\frac{I_C}{2V_T}(r_E + r_B)\left(1 + \frac{f_T^2}{\beta_0 f^2}\right) + \frac{n^2}{4}\left(1 + \frac{f_T^2}{\beta_0 f^2}\right)} = Z_0 \quad (2)$$

and determining the optimized emitter length $l_E$, by running a simulation using a scalable model to bias the transistor at the optimal noise density and adjust $l_E$ until $R_{SOP}(l_E)=Z_0$ the characteristic impedance of the circuit, thereby determining the transistor size and bias current. Thus, the optimal noise current density is determined by using $F_{MIN}$ vs. $\log(I_c)$ curves.

Preferably, the design is carried out using a commercially available design tool such as HSPICE™. The scalable models provide analytical equations for determination of the noise and impedance parameters of the transistors and passive components using a standard design tool. These equations were used to develop customised input decks for HSPICE to derive the required design parameters. Sample input decks developed for HSPICE for either bipolar transistors or MOSFETs are included in Appendices A and B, respectively. Alternatively appropriately customised decks to solve the equations may be created for other design tools. Thus optimized performance is readily obtainable with commercially available or custom design tools.

Thus, optimized noise and impedance matching of an integrated circuit is achieved in a integrated circuit of simple design by a two stage design approach providing a noise optimized transistor and a minimal inductor network for impedance matching. A simple transistor-inductor structure implemented in silicon, which is simultaneously noise and impedance matched. This structure is advantageously used to provide silicon implementations of LNA and double balanced mixer circuits with high frequency performance previously only reported for similar circuits implemented with III–V based technology.

BRIEF DESCRIPTION OF THE DRAWINGS

FIG. 4 shows graphical plot of the dependence of the noise parameter $F_{MIN}$, and transistor parameters $f_T$ and $f_{MAX}$, on the collector current Ic of the transistor, from which, for a given transistor geometry $l_E>>w_E$, and bias voltage $V_{CE}$, the optimal noise current density $J_C$ is derived at a desired frequency $\omega_T$.

FIG. 5 shows a graphical plot of the emitter length $l_E$ as a function of noise parameters $F_{MIN}$, $F_{50}$ and the optimal source impedance $R_{sop}$, from which the emitter length is adjusted to set $R_{sop}(l_E)$ equal to the characteristic impedance of the system $Z_0$, typically 50Ω, to achieve noise matching of the transistor;

FIG. 6 shows the optimum noise impedance of the transistor plotted on a Smith chart at the end of the transistor design stage;

FIG. 7 represents the low noise circuit design flow step of adding an emitter inductor $L_E$ to match the real part of the input impedance to $Z_0$;

FIG. 8 represents the low noise circuit design flow step of adding a base inductor $L_B$ to simultaneously match the imaginary part of the input impedance and noise impedance to 0Ω;

DESCRIPTION OF THE EMBODIMENTS

Figure 1:
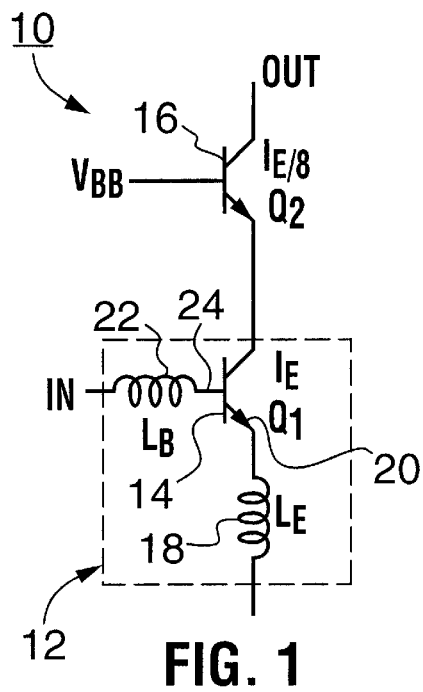
FIG. 1 shows a circuit schematic of part of a monolithic silicon integrated circuit comprising a transistor-inductor structure according to a first embodiment of the present invention.

Part of a monolithic silicon integrated circuit 10 comprising an integrated transistor-inductor structure 12 according to a first embodiment of the present invention is shown schematically in FIG. 1, and comprises a first transistor 14, which is a common emitter bipolar transistor $Q_1$ for low noise amplification, and a second transistor 16, which is a common base transistor Q2 for input/output buffering, the two transistors being coupled in cascode configuration; a first inductor 18 $L_E$ is coupled to the emitter 20 of the first transistor $Q_1$; and, a second inductor 22 $L_B$ coupled to the base 24 of the first transistor $Q_1$. Noise and impedance matching of the transistor-inductor structure is achieved by designing the transistor 14 having an specific geometry, and in particular a specific emitter length $l_E$, which provides that the real part of its optimum noise impedance at the desired frequency of operation and collector current density is equal to the characteristic impedance $Z_0$ of the system, i.e. the integrated circuit Once the transistor geometry is determined to provide noise matching, design of the matching network is reduced to adding a very simple passive matching network using only two inductors. The first inductor 20, $L_E$, provides matching of the real part of the input impedance, and the second inductor 22, $L_B$ cancels out the noise reactance and input impedance reactance of the structure. Specifically the inductance values are determined to be $L_E = Z_0/\omega_T$, and $L_B = 1/\omega^2 C_{in} - L_E$.

The size ratio of the emitter lengths of the first and second transistors is determined by the ratio of the $f_T$ current density to the minimum noise current density. In the circuit represented in FIG. 1, the ratio is 8 to 1, which is technology dependent.

Thus an integrated transistor-inductor structure comprising a transistor Q1 having an emitter length $l_E$ designed to provide noise matching at a desired operating frequency, and a simplified matching network of two inductors $L_E$ and $L_B$ of the appropriate values to provides impedance matching of the circuit, provides a simultaneously noise and impedance matched circuit. This structure is particularly advantageous in optimising performance of silicon based circuits for wireless and RF applications.

The design of the transistor-inductor structure is based on a design methodology, i.e. a method of designing an integrated circuit according to another aspect of the present invention, which will be described in detail in the following section, and in which the geometry of the transistor is determined by design, i.e. considered to be a variable rather than fixed design parameter. That is, the emitter length of a bipolar transistor, or correspondingly, the gate width of a field effect transistor (FET), is adjusted so that the transistor is noise matched to the characteristic impedance of the system, typically 50 Ω, at the desired operating frequency, thereby minimizing the losses in the passive network around the transistor. Since the transistor is an active device, noise matching is achieved without losses and without noise figure degradation. The task of noise matching is thus removed from the passive network. The resulting matching network is therefore simpler, and less lossy than in presently known circuit designs.

To complete the noise and impedance matched transistor structure, a minimal passive network comprising two lossless integrated inductors is designed to provide impedance matching with the lowest possible degradation of the overall noise figure. The minimal matching network, reduces components and saves area, and therefore contributes to significant cost reduction.

Optimization and design of the integrated transistor-inductor structure of the circuit is possible only by the availability of scalable models for transistors, as described in a reference co-authored by the present inventors, entitled "A scaleable high frequency noise model for bipolar transistors with application to optimal transistor sizing for Low noise amplifier design" to be published at the Bipolar Circuits and Technology Meeting, Sep. 30, 1996, which is incorporated herein by reference. The scalable models provide analytical equations describing noise parameters, as a function of the optimal noise current density $J_{Q1}$.

As described in this reference, a series of three equations were derived, defining the noise resistance $R_n$, optimum source admittance, $Y_{SOP}$, and minimum noise figure $F_{MIN}$, as functions of the shot noise current sources, transistor Y parameters, series emitter resistance $r_E$, and the total base resistance $R_B$. The bias current dependence of the noise parameters appears in explicit form via terms in $I_B$ and $I_C$, and also implicitly in $r_B$ and in the Y parameters. In derivation of these equations, it was assumed that the base and collector noise currents are uncorrelated. This is a reasonable simplification given the different physical origins of the two noise currents.

For bias current and frequency ranges used in wireless design, the model reduces to the following simplified yet accurate equations $$F_{MIN} = 1 + \frac{I_C}{V_T |Y_{21}|^2} \left( \text{Re}\{Y_{11}\} + \sqrt{\left[1 + \frac{2V_T |Y_{21}|^2 (r_E + r_B)}{I_C}\right]\left[|Y_{11}|^2 + \frac{I_B |Y_{21}|^2}{I_C}\right] - (\text{Im}\{Y_{11}\})^2} \right) \quad (1)$$

$$R_{sop} \cong \frac{R_n f_T}{f} \frac{\sqrt{\frac{I_C}{2V_T}(r_E + r_B)\left(1 + \frac{f_T^2}{\beta_0 f^2}\right) + \frac{n^2 f_T^2}{4\beta_0 f^2}}}{\frac{I_C}{2V_T}(r_E + r_B)\left(1 + \frac{f_T^2}{\beta_0 f^2}\right) + \frac{n^2}{4}\left(1 + \frac{f_T^2}{\beta_0 f^2}\right)} = Z_0 \quad (2)$$

$$L_E \cong \frac{Z_0}{2\pi f_T} \quad (3)$$

$$X_{sop} \cong \frac{\frac{nR_n f_T}{2f}}{\frac{I_C}{2V_T}(r_E + r_B)\left(1 + \frac{f_T^2}{\beta_0 f^2}\right) + \frac{n^2}{4}\left(1 + \frac{f_T^2}{\beta_0 f^2}\right)} - 2\pi f L_E \quad (4)$$

$$L_B \cong \frac{1}{\omega^2 C_{in}} - L_E \quad (5)$$

These equations can be employed to tailor the device size. Typically, for a bipolar transistor, it is required only to optimize the emitter length $l_E$ to achieve optimal low noise performance and minimum matching network losses. Once a noise matched transistor is obtained, impedance matching is achieved very simply by selecting appropriate values for the two inductors $L_E$ and $L_B$ as defined by equations 3 and 5. These two inductors are the only required passive components used for impedance matching. The structure is compact, and the minimal impedance matching circuit contributes significantly to reducing possible degradation of the overall noise figure of a monolithically integrated transistor-inductor structure.

As indicated by equations (1) and (2), the noise resistance and the optimum noise admittance scale as $l_E$ and $l_E^{-1}$, respectively. β is the dc current gain and n is the collector current ideality factor, typically n=1.

$F_{MIN}$ of the transistor is invariant to changes in emitter length provided that the length to width ratio $l_E/w_E$ of the emitter stripe is greater than 10.

All noise parameters are non-linear functions of emitter width, $w_E$ through the $Ic(r_E + r_B)$ term. The ability to predict the impact of the statistical emitter width and length variations on the noise parameters depends on the availability of a physically based, scalable compact model.

While noise parameters are available from the post processor of microwave circuit simulators such as LIBRA, only equivalent noise voltages and currents can be modelled directly using SPICE like simulators. Thus customised HSPICE input decks were developed, based on equations 1 to 3, to compute simultaneously $F_{MIN}$, $f_T$, $f_{MAX}$, $R_n$ and $Y_{sop}$ as functions of $I_c$ in a single simulation run. The HSPICE calculated noise parameters were found to agree within 0.25 dB up to 10 GHz with those generated by LIBRA.

For the combination of the first transistor and the two inductors, a unique combination of $l_{E1}$, $J_{Q1}$, $L_E$ and $L_B$ is determined that leads to a structure with minimum noise figure $F_{MIN}$ and ideal input impedance match. While the second transistor is optional and may be omitted, for practical purposes the second transistor is included in order to maximize the power gain and the frequency of operation. The size of the second transistor Q2 is selected such that it is biased at the current density at which its cut-off frequency reaches a maximum. The size ratio of Q1 to Q2 depends on the ratio of the peak $f_T$ current density to the minimum noise current density.

In practice, the design of a noise and impedance matched circuit is achieved in two stages, I) the noise matched transistor design stage and II) the circuit design stage in which simultaneous impedance and noise matching is pursued.

Based on the scalable model described in the above mentioned reference, the first stage of the design process involves finding the optimal noise current density, from an analytic equation as set out below, using a commercial design tool, i.e. HSPICE.

The noise parameter equations set out in the references, in analytical format were entered in an HSPICE simulator input deck to compute simultaneously the minimum noise figure $F_{MIN}$, the cut-off frequency $f_T$, maximum oscillation frequency $f_{MAX}$, noise resistance $R_n$, and optimum source admittance $Y_{SOP}$ as functions of the transistor collector current $I_c$ for a bipolar transistor, (or correspondingly, as functions of transistor drain current $I_D$ when a MOSFET transistor is to be considered). Corresponding sample HSPICE decks for a bipolar and MOSFET transistor are given in the appendices A and B respectively.

The design of the optimized structure of FIG. 1, based on a bipolar transistor,.is described in the following example:

Stage I

Figure 4:
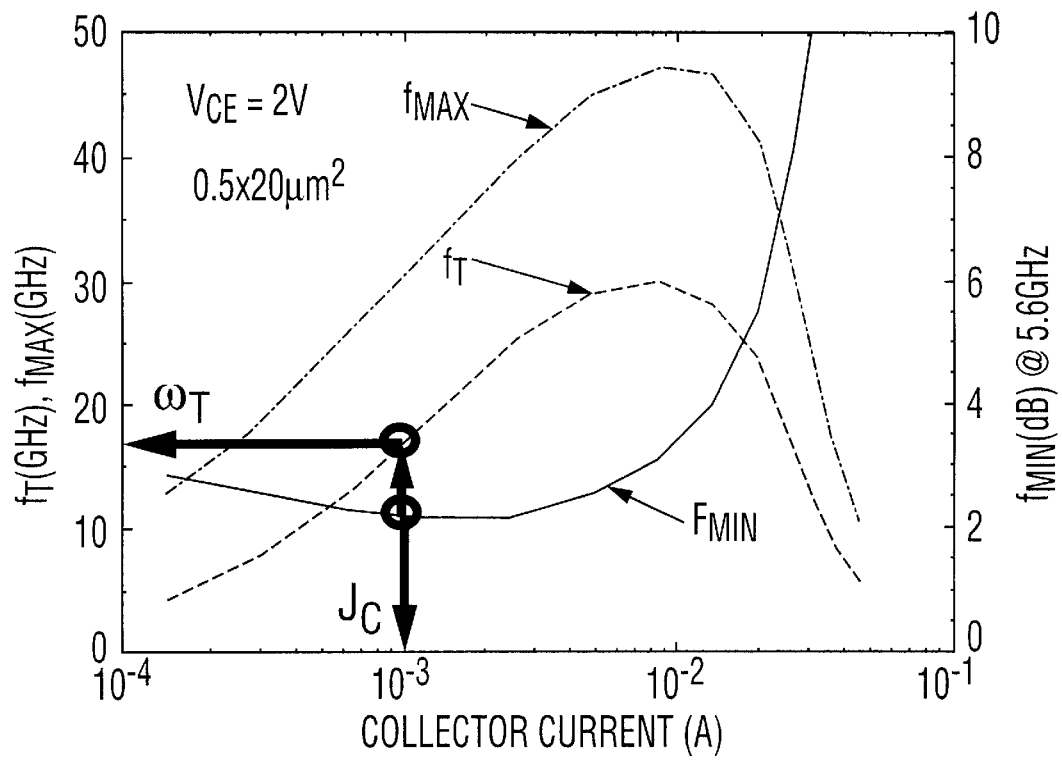
FIGS. 4 to 8 represent sequential steps in the design flow for the transistor-inductor structure of the first embodiment, i.e.
Figure 5:
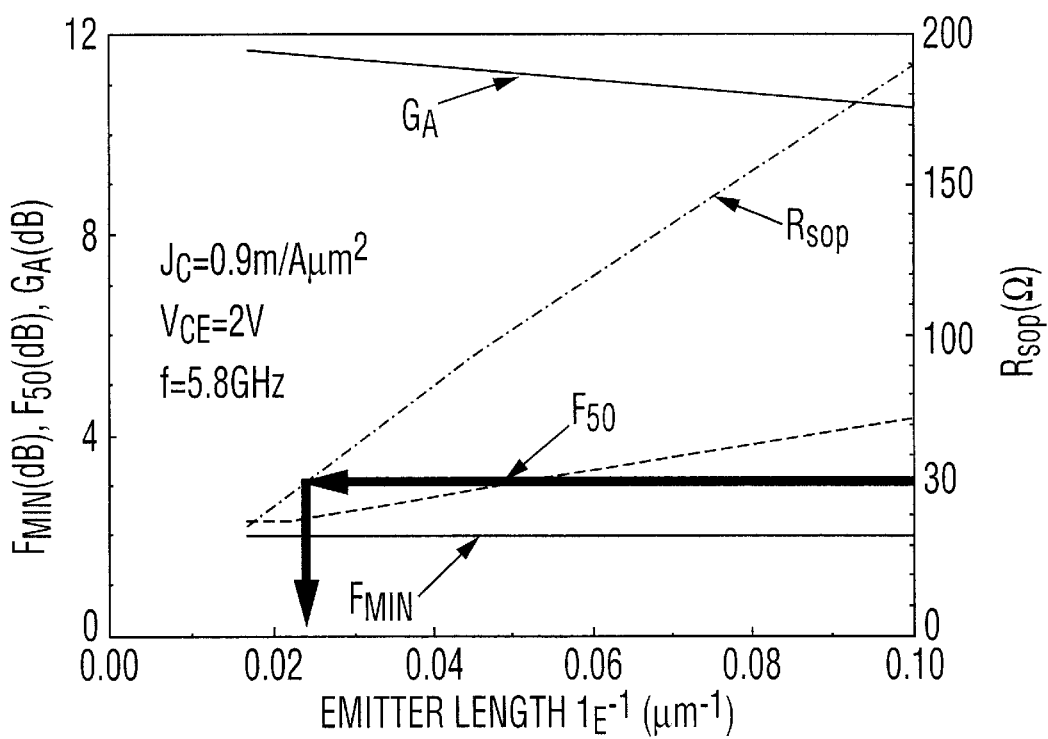

The optimal noise current density $J_{Q1}$ is obtained from equation (1) using an HSPICE deck, as represented in FIG. 4, which shows graphically the dependence of $F_{MIN}$, $f_T$ and $f_{max}$ on the collector current. From this data, the optimal noise current density $J_{Q1}$ is determined for the desired operating frequency. Since $R_{sop}$ is a function of $l_E$, the emitter length, this parameter is adjusted so that the optimum source resistance $R_{SOP}$ equals the characteristic impedance of the system $Z_0$ (50Ω) at the minimum noise current density and at frequency f, as expressed in equation (2), which is represented graphically in FIG. 5.

Figure 6:
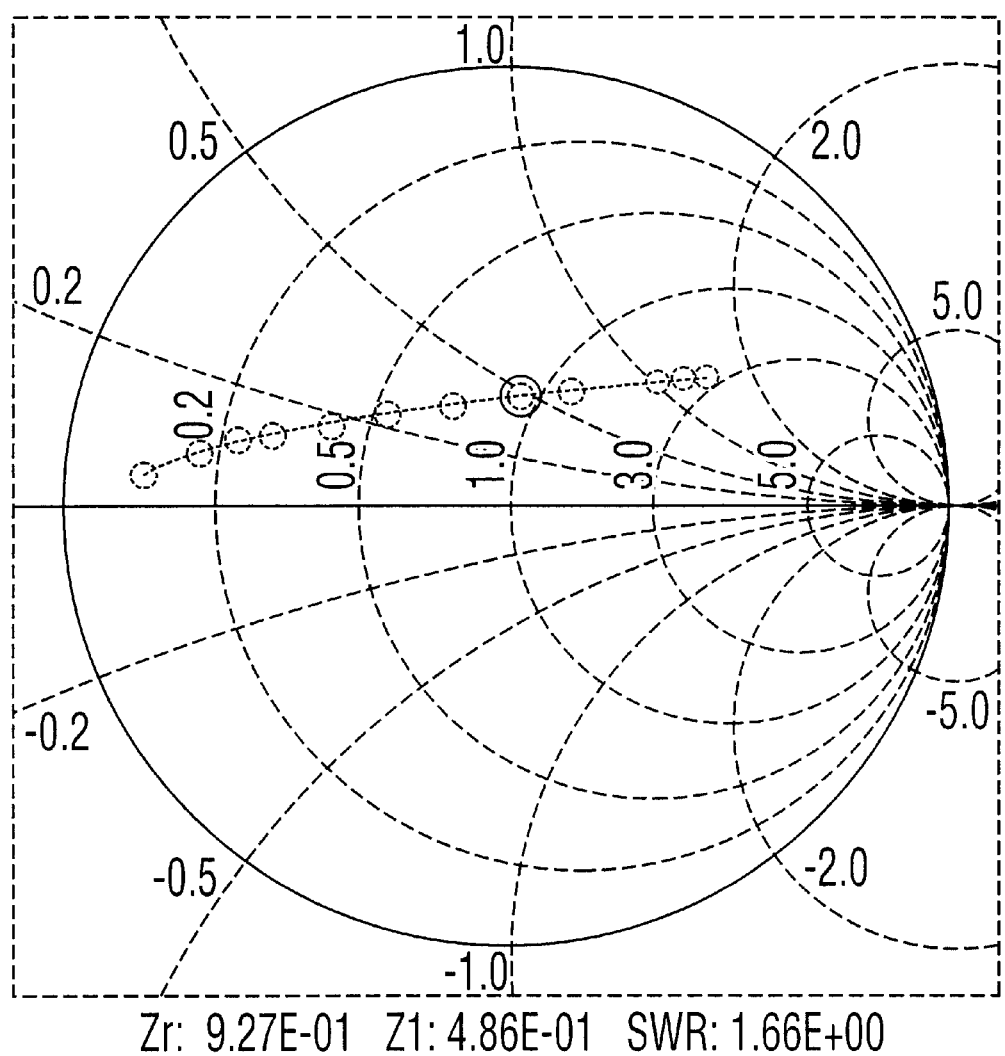

By these two steps, the transistor size, specifically $l_E$ and bias current are determined. The optimum noise impedance of the transistor at the end of the first stage is shown plotted on a Smith chart in FIG. 6.

Stage II

Figure 7:
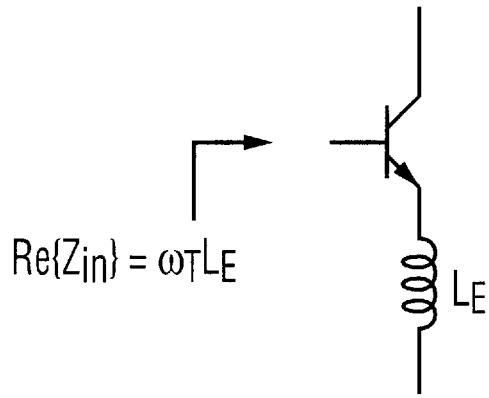

Once the optimized geometry of the noise matched transistor is determined, an emitter inductor $L_E$ is added to match the real part of the input impedance to $Z_0$ as shown in FIG. 7, and defined by equation (3) as a function of the frequency $f_T$.

Figure 8:
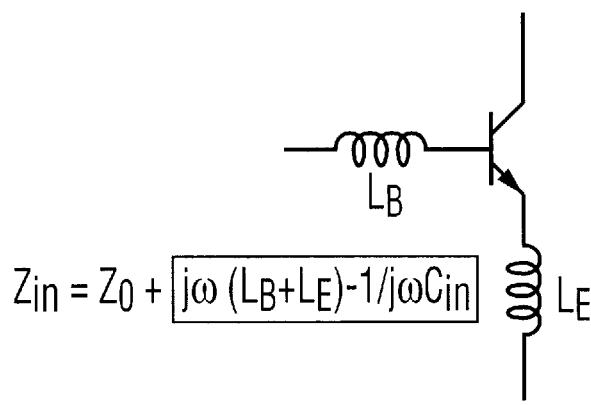

If lossless, $L_E$ does not change the value of $R_{SOP}$ but it does affect the source reactance $X_{SOP}$ which is defined by equation (4). Finally, simultaneous noise and input impedance matching is obtained by connecting an inductor $L_B$ in the base of the transistor Q1 as shown in FIG. 8. This inductor cancels out the reactance due to the input capacitance, $C_{in}$, of the device, and at the same time, it transforms the optimum noise reactance of the amplifier to 0Ω. $L_B$ is defined by equation (5).

In essence, this design methodology ensures that the real part of the optimum noise impedance of the transistor is equal to the characteristic impedance $Z_0$ at desired frequency and collector current density.

Optimal noise and input impedance matching is achieved with the simplest matching network. Optionally, a suitable matching network in the collector may be added to maximize the power gain. The scaleable model allows for the transistor size to be uniquely dimensioned in order to achieve optimal noise matching. The optimal transistor size and bias current decrease with increasing frequency.

This approach differs significantly from conventional designs in which the transistor size is not a design variable, but a fixed parameter which cannot be optimized by a circuit designer. A scaleable noise model has not previously been available in the literature. Conventional circuit design for low noise has relied on time consuming trial and error processes.

Single transistor test structures with emitter inductors only, and with both base and emitter inductors were fabricated in a proprietary Northern Telecom silicon bipolar process (NT25) at 1.9, 2.4 and 5.8 GHz. As described in the above mentioned reference to Voinigescu, test structures were fabricated with various emitter widths, lengths, and single and multistripe geometries.

Agreement between measured parameters and Spice Guinmel Poon modelled parameters were well within the typical on wafer noise measurement error.

Measured data confirmed the simultaneous noise and impedance match. The input return loss was better than −19 dB in all examples. The finite Q of the fabricated inductors on silicon substrates was typically in the range from 7 to 10, degrading the noise figure by 0.7 to 1.4 dB. It was found that the base inductor contributed 0.4 to 0.7 dB to the measured overall noise figure.

Figure 2:
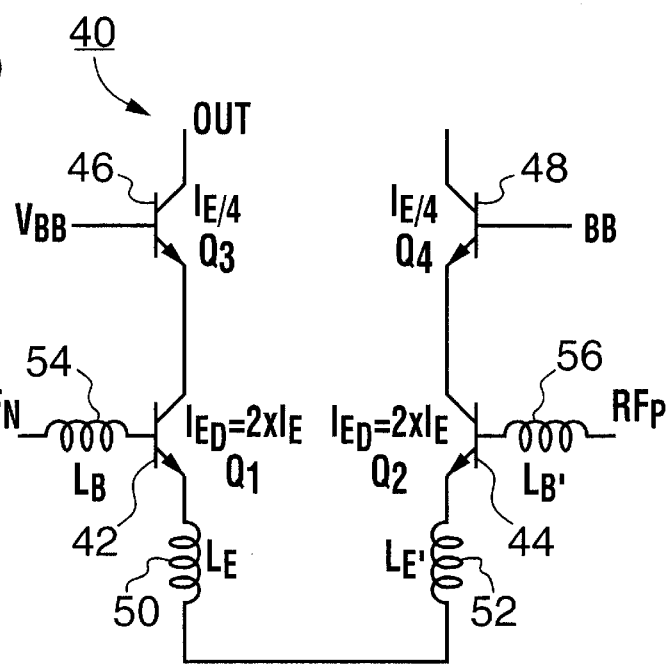
FIG. 2 shows a circuit schematic of part of a monolithic silicon integrated circuit comprising a transistor-inductor structure according to a second embodiment of the present invention.

Part 40 of a monolithic silicon integrated circuit operable as a differential amplifier according to a second embodiment of the present invention is shown schematically in FIG. 2. This circuit is the differential-equivalent of the single ended amplifier structure 10 shown in FIG. 1. Thus, the circuit 40 comprises an input pair 42 and 44 of common emitter bipolar transistors Q1 and Q2 for low noise amplification, and an output pair 46 and 48 of common base bipolar transistors Q3 and Q4 for input/output buffering, the two pairs being coupled in cascode configuration. Inputs for supplying differential RF signals $RF_N$ and $FR_P$ are coupled to the emitters of the input pair Q1 and Q2, and differential output signals $OUT_P$ and $OUT_N$ generated at outputs coupled to the collectors of output pair Q3 and Q4. Matching of the real part of the noise impedance of the input pair of transistors Q1 and Q2 is achieved as described for the single ended structure of the first embodiment, by design of the transistors Q1 and Q2 with appropriate an emitter length to make the real part of its optimum noise impedance at the desired frequency of operation and collector current density equal to the characteristic impedance $Z_0$.

It may be shown that the minimum noise figure of a differential amplifier stage is identical to that of a single ended amplifier stage. Consequently, the size of each of the transistors, i.e. the emitter length $l_{ED}$ of the input pair Q1 and Q2 of the differential amplifier is roughly twice as large as that of the single ended stage. Therefore, the emitter length is indicated as $l_{ED}=2\times l_E$ where $l_E$ is the emitter length of the input transistor of the corresponding single ended circuit shown in FIG. 2. Emitter inductors 50 and 52, $L_E$ and $L_E'$, provide matching of the real part of the input impedance and base inductors 52 and 54, $L_B$ and $L_B'$, cancel out the noise reactance and input impedance reactance of the structure, as described for the structure of the first embodiment, to complete noise and impedance matching. Specifically the inductance values are determined to be $L_E = Z_0/\omega_T$, and $L_B = 1/\omega^2 C_{in} L_E$. Analogously, the ratio of the sizes of the first and second pairs of transistors, i.e. emitter lengths of the Q1 and Q2, relative to the emitter lengths of Q3 and Q4, is by the ratio of the peak $f_T$ current density to the minimum noise current density, as determined for the single ended amplifier. Thus the emitter lengths of Q3 and Q4 are ⅛ of the emitter length $l_{ED}$ of the input pair $Q_1$ and $Q_2$, or as shown in FIG. 2, as $l_E/4$ where $l_E$ is the emitter length of the input transistor of the corresponding single ended circuit shown in FIG. 1.

Figure 3:
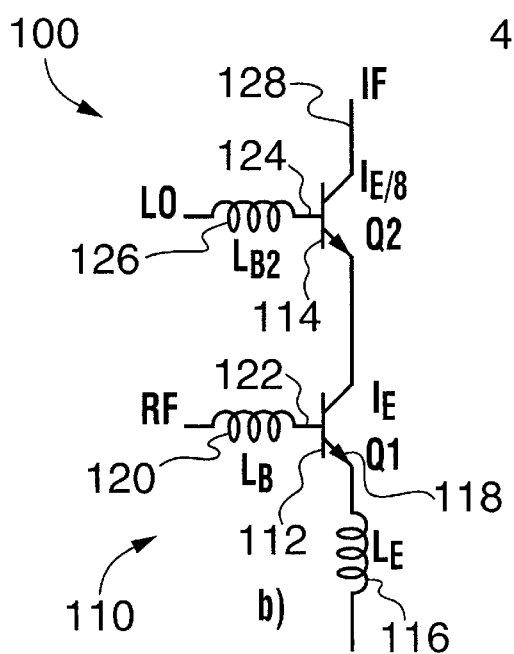
FIG. 3 shows a circuit schematic of part of a monolithic silicon integrated circuit comprising a transistor-inductor structure according to a third embodiment of the present invention.

Part of a monolithic silicon integrated circuit 100 operable as a mixer circuit and comprising an integrated transistor-inductor structure 110 according to a third embodiment of the present invention is shown schematically in FIG. 3, and comprises a first transistor 112, which is a common emitter bipolar transistor $Q_1$ for low noise amplification, and a second transistor 114, which is a common base transistor $Q_2$ for mixing, the two transistors being coupled in cascode configuration; a first inductor 116 $L_E$ is coupled to the emitter 118 of the first transistor $Q_1$; and, a second inductor 120 $L_B$ coupled to the base 120 of the first transistor $Q_1$. An RF signal is supplied to an input coupled to the base of the first transistor Q1 through $L_B$, and an LO input signal are supplied to an input coupled to the base 124 of the second transistor Q2 through another base inductor 126 $L_{B2}$, thereby generating an IF output signal at an output coupled to the collector 128 of the second transistor Q2. As in the low noise amplifier configuration of the first embodiment, noise and input impedance matching of the transistor-inductor structure is achieved by designing the transistor 112 having an specific geometry, and in particular a specific emitter length $l_E$, which provides that the real part of its optimum noise impedance at the desired frequency of operation and collector current density is equal to the characteristic impedance $Z_0$ of the system, i.e. the integrated circuit. Once the transistor geometry is determined to provide noise matching, design of the matching network is reduced to adding a very simple passive matching network using only two inductors. The first inductor $L_E$, provides matching of the real part of the input impedance, and the second inductor $L_B$ cancels out the noise reactance and input impedance reactance of the structure. Specifically the inductance values are determined to be $L_E = Z_0/\omega_T$, and $L_B = 1/\omega^2 C_{in} \cdot L_E$. The size ratio of the transistor Q1 and Q2, i.e. the ratio of the emitter lengths of the first and second transistors 112 and 114, is determined by the ratio of the peak $f_T$ current density to the minimum noise current. In this example the emitter length ratio was 8:1, which is technology dependent.

To demonstrate the performance improvements achieved in application of the matched transistor-inductor structure, two silicon integrated circuits were designed, a double balanced mixer and a low noise amplifier, for application in a 5.8 GHz down-converter. The two circuits were designed to be simultaneously noise and impedance matched at the RF input, and were fabricated in a proprietary Northern Telecom 25GHz silicon bipolar process technology (NT25) using implanted base, double polysilicon transistors, inductors, and microstrip transmission lines. The three layer metallization with 2 µm thick aluminum top metal layer allows for the fabrication of inductors with Q's in the 6–10 range, and of metal 1 grounded microstrip lines with Qs of 6, at 26 GHz. Transistors have $f_T$ and $f_{MAX}$ of 24 GHz and 38 GHz respectively at $V_{CE}=1$ V. $NF_{MIN}$ is typically 2 dB at 5.8 GHz and $BV_{CEO}$ and $BV_{CBO}$ are 4.2 V and 15 V respectively.

Figure 9:
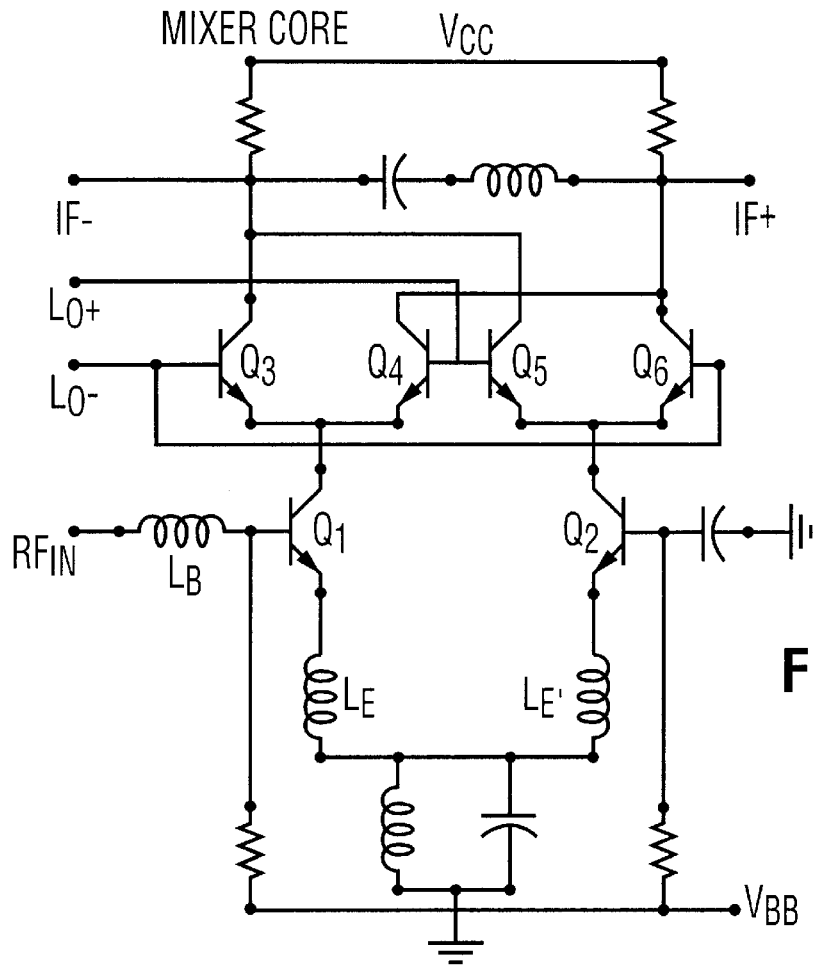
FIG. 9 shows a circuit schematic of a LNA (core) circuit according to a fourth embodiment of the present invention.

A schematic of the core of a silicon double balanced mixer circuit according to a fourth embodiment of the present invention is shown in FIG. 9. The circuit is a development based on a CDMA GaAs MESFET mixer architecture described in the Brunel reference, which is is a modified Gilbert cell mixer incorporating an inductor/capacitor/resistor matching network. The circuit shown in FIG. 9 differs in incorporating the noise and impedance matched transistor-inductor structure, which simplifies the matching network, as described above, and allows for implementation in silicon with performance comparable to GaAs at 5.8 GHz. The mixer comprises an input pair of common emitter transistors Q1 and Q2, each coupled to respective common source differential pairs Q3, Q4 and Q5, Q6 which form a mixing quad. Differential RF inputs are coupled to the bases of the input pair, and differential LO inputs are coupled to the bases of differential pairs of the mixing quad to generate differential IF output signals at outputs coupled to collectors of the pairs the mixing quad.

The emitter lengths of Q1 and Q2 are designed to provide matching of the real part of the noise impedance, and first and second inductors provide a passive matching network, as described above. Thus, the emitter inductors $L_E$ and $L_E'$ provide matching of the real part of the input impedance to $Z_0$. The base inductor $L_B$ provides for cancelling the imaginary part of the input impedance and the noise reactance. Since one of the RF inputs is AC grounded, a single base inductor $L_B$ only is required. The mixer also features an LO reject, series LC filter between the differential IF outputs, and a parallel LC resonator, tuned on the second RF harmonic, as an AC current source in the emitter of the input pair.

Inductors, $L_E$, replace conventional resistors for emitter degeneration. The inductors alleviated to a large degree the trade off between IIP3 and the noise figure. However, since the input third order intercept point, IIP3, is proportional to $\omega g_m L_E$ and, since for ideal input match $L_E = Z_0/2\pi f_T$, IIP3 and input matching become intertwined, that is, IIP3$\sim \omega g_m Z_0/2\pi f_T$.

In integrated circuit implementations, $Z_0$ can usually be increased from the typical 50Ω, if required, in order to further improve IIP3.

Figure 10:
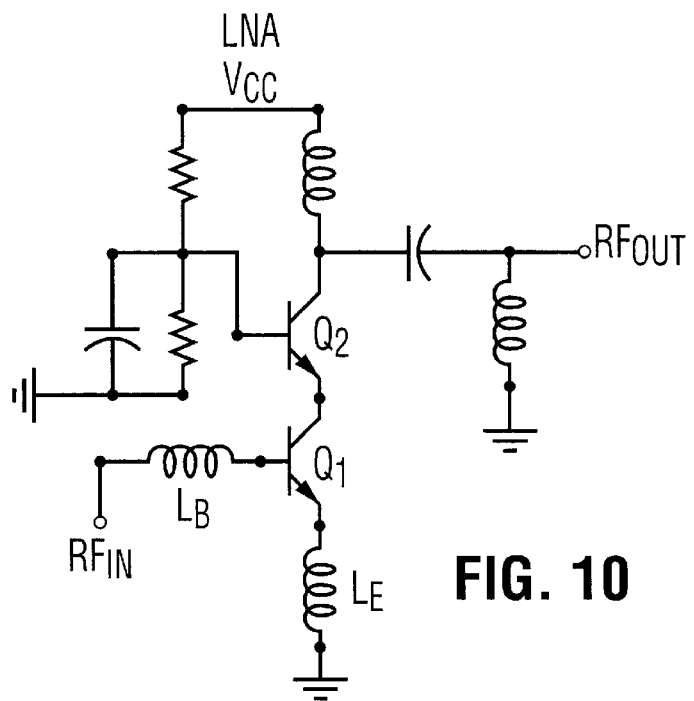
FIG. 10 shows a circuit core schematic of a double balanced mixer (core) circuit according to a fifth embodiment of the present invention.

A silicon low noise amplifier (LNA) circuit according to a fifth embodiment is shown in FIG. 10, and has an architecture similar to that usually implemented in GaAs circuits. The circuit differs in that it incorporates the simultaneously noise and impedance matched transistor-inductor structure comprising bipolar transistor Q1, and inductors $L_E$ and $L_B$, as described in the first embodiment, and is implemented in silicon for operation at 5.8 Ghz.

As shown in FIG. 10, the first transistor Q1 is a 2+0.5*20 m² biopolar device, biased at a minimum noise current of 2.2 mA. This is different from the mixer circuit of the fourth embodiment, which is fully differential. It can be demonstrated that the minimum noise figure of a differential stage is identical to that of the half circuit and that the optimum noise impedance is two times larger. As a result, the size of each of the transistors in the input pair of the double balanced mixer of FIG. 9 is 4+0.5*20 µm² and bias current is 4 mA, roughly twice those of the LNA (FIG. 10). Both circuits are noise and input impedance matched to 50Ω. In order to maximize gain and bandwidth, the size of the transistors in the mixing quad was chosen 8 times smaller than that of the input pair, as indicated in the basic transistor-inductor structure shown in FIG. 1. The size ratio corresponds to the ratio of the peak $f_T$ current density and the minimum noise current density. A similar approach is used for common base transistor Q2 in the LNA to increase gain by 1 to 2 dB.

Figure 14:
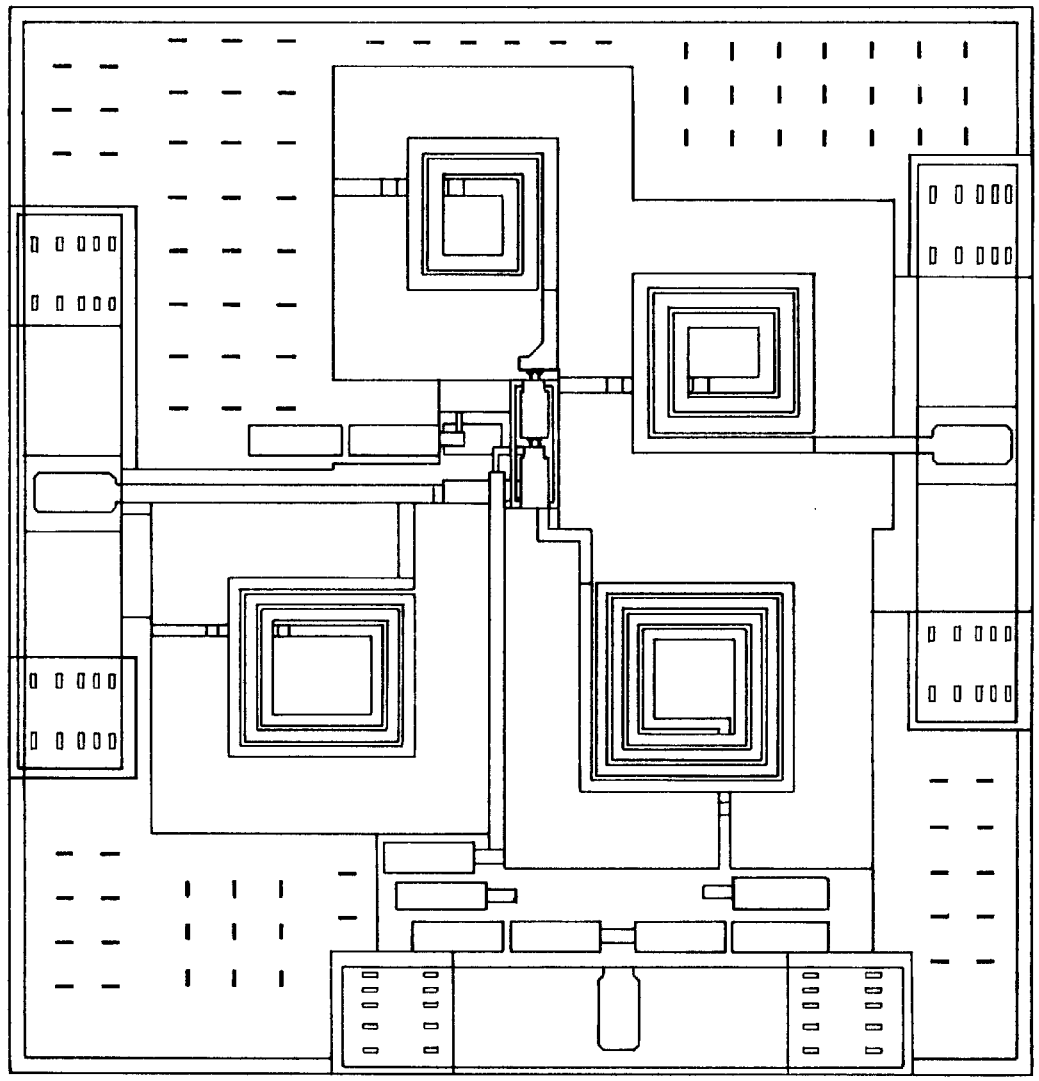
FIG. 14 shows a schematic layout of the low noise amplifier circuit of the fourth embodiment.
Figure 14A:
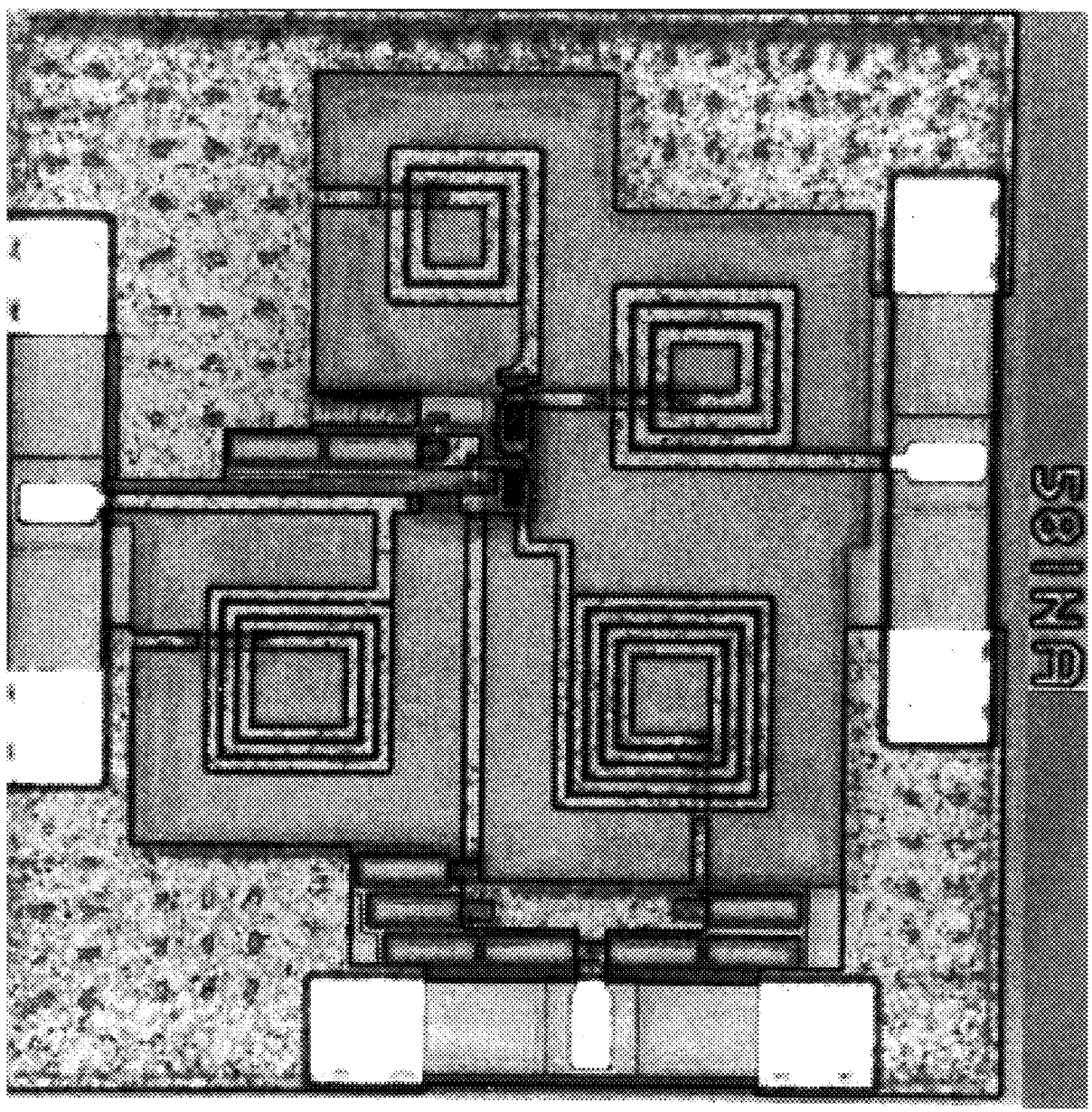
FIG. 14A shows a photomicrograph of the circuit layout on a reduced scale.
Figure 15:
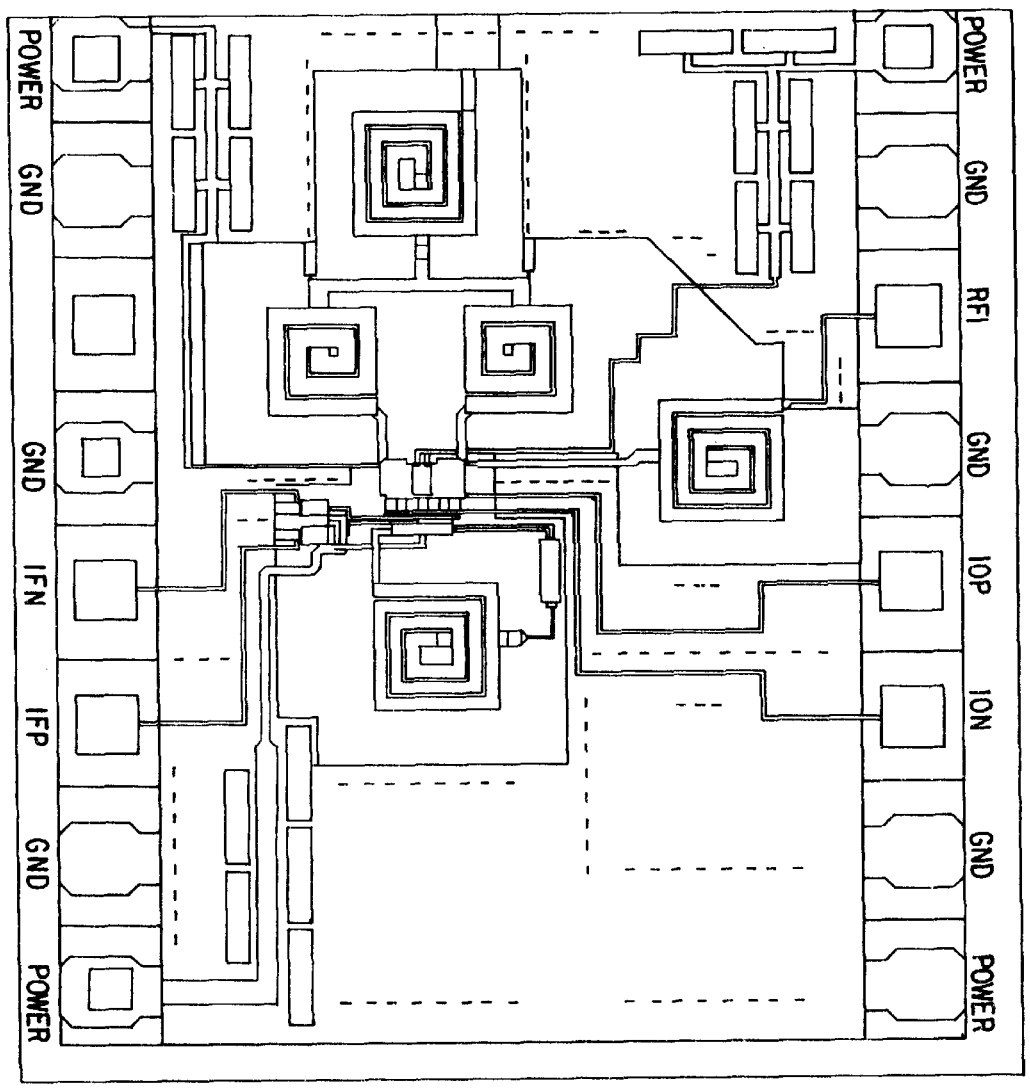
FIG. 15 shows a schematic layout of the mixer circuit of the fifth embodiment.
Figure 15A:
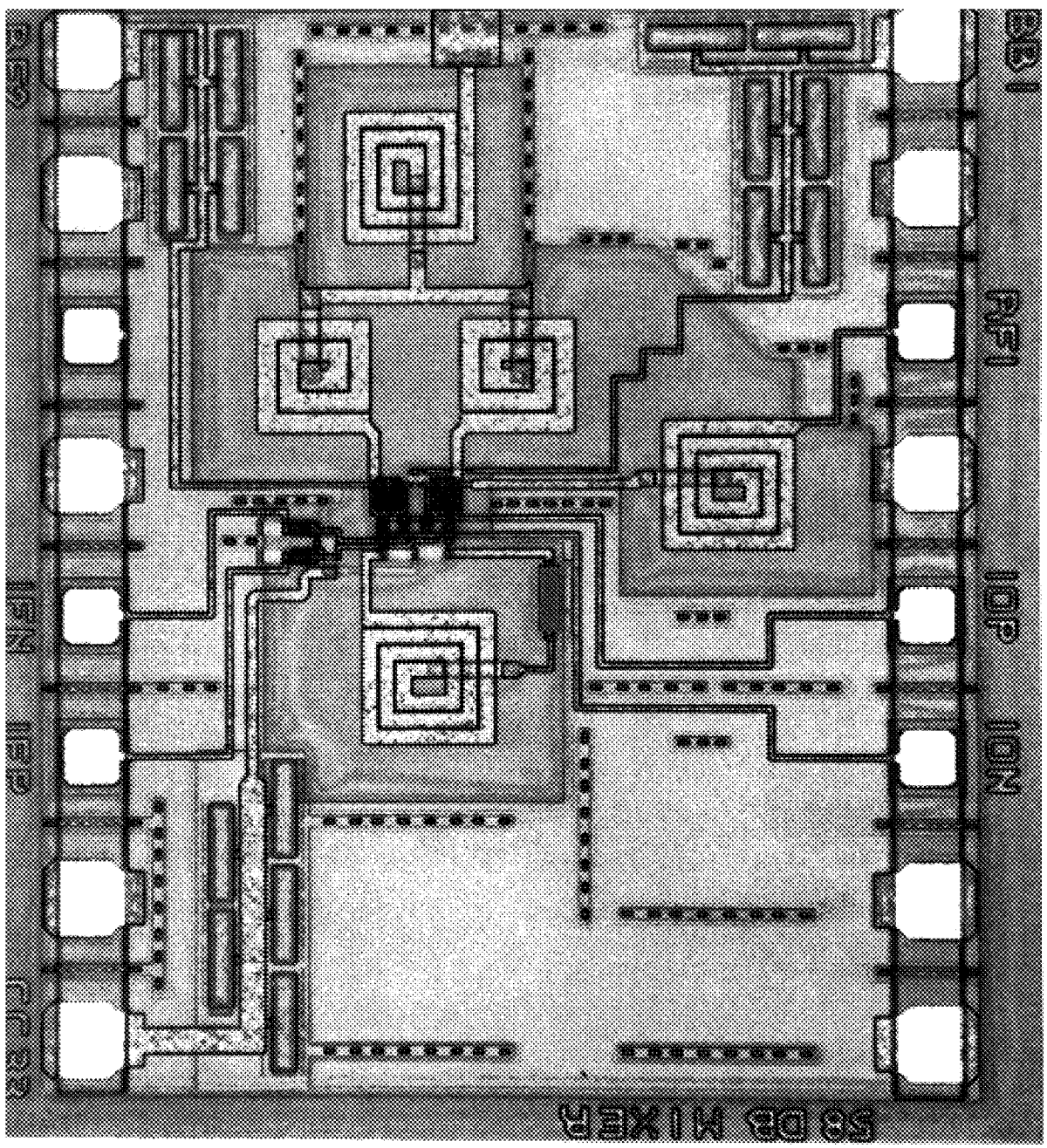
FIG. 15A shows a photomicrograph of the circuit layout on a reduced scale.

Schematic layouts of the integrated circuits for the LNA and double balanced mixer circuits are shown in FIGS. 14 and 15. Corresponding photomicrographs of the actual integrated circuit layouts, on a reduced scale, are shown in FIGS. 14A and 15A. 50Ω microstrip transmission lines with metal 1 ground planes were used at the local oscillator inputs, in order to minimize substrate losses and to provide a controlled and dispersion free transmission medium.

Figure 11:
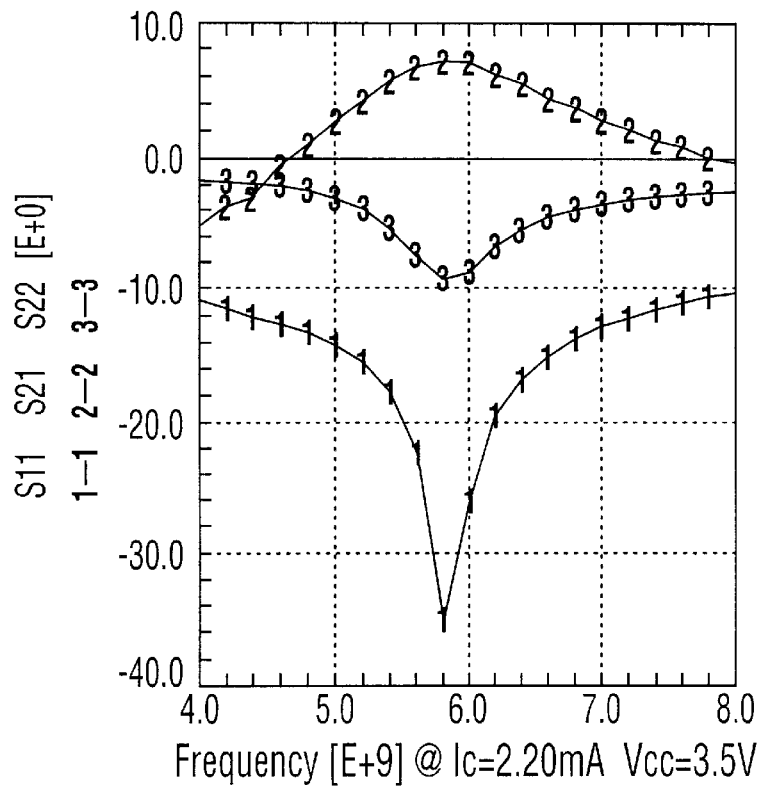
FIG. 11 shows measured values for the conversion gain and input and output return loss for the low noise amplifier circuit of the fourth embodiment.
Figure 12:
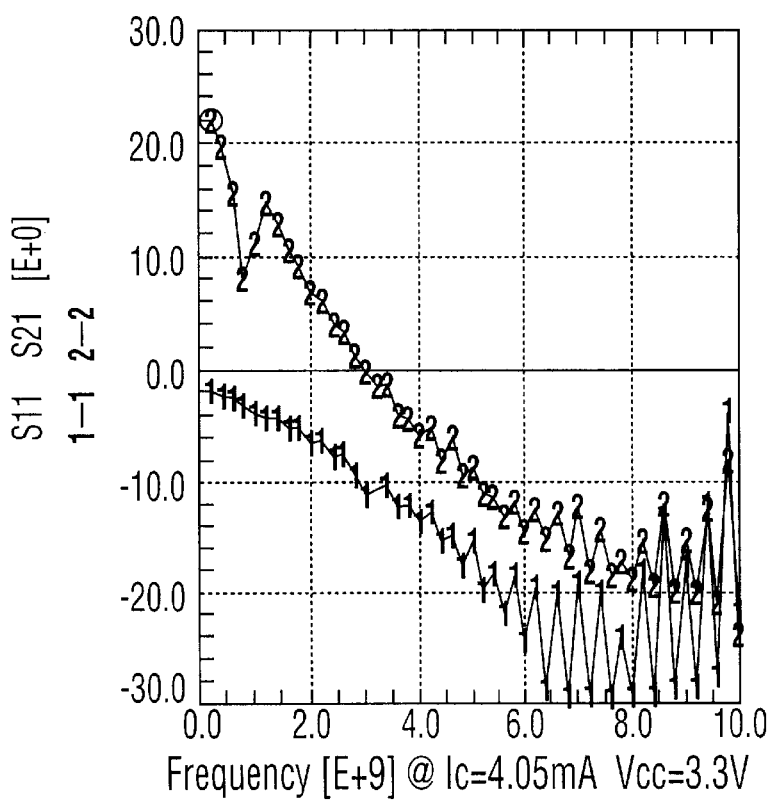
FIG. 12 shows measured values for the conversion gain and input return loss for the mixer circuit of the fifth embodiment.
Figure 13:
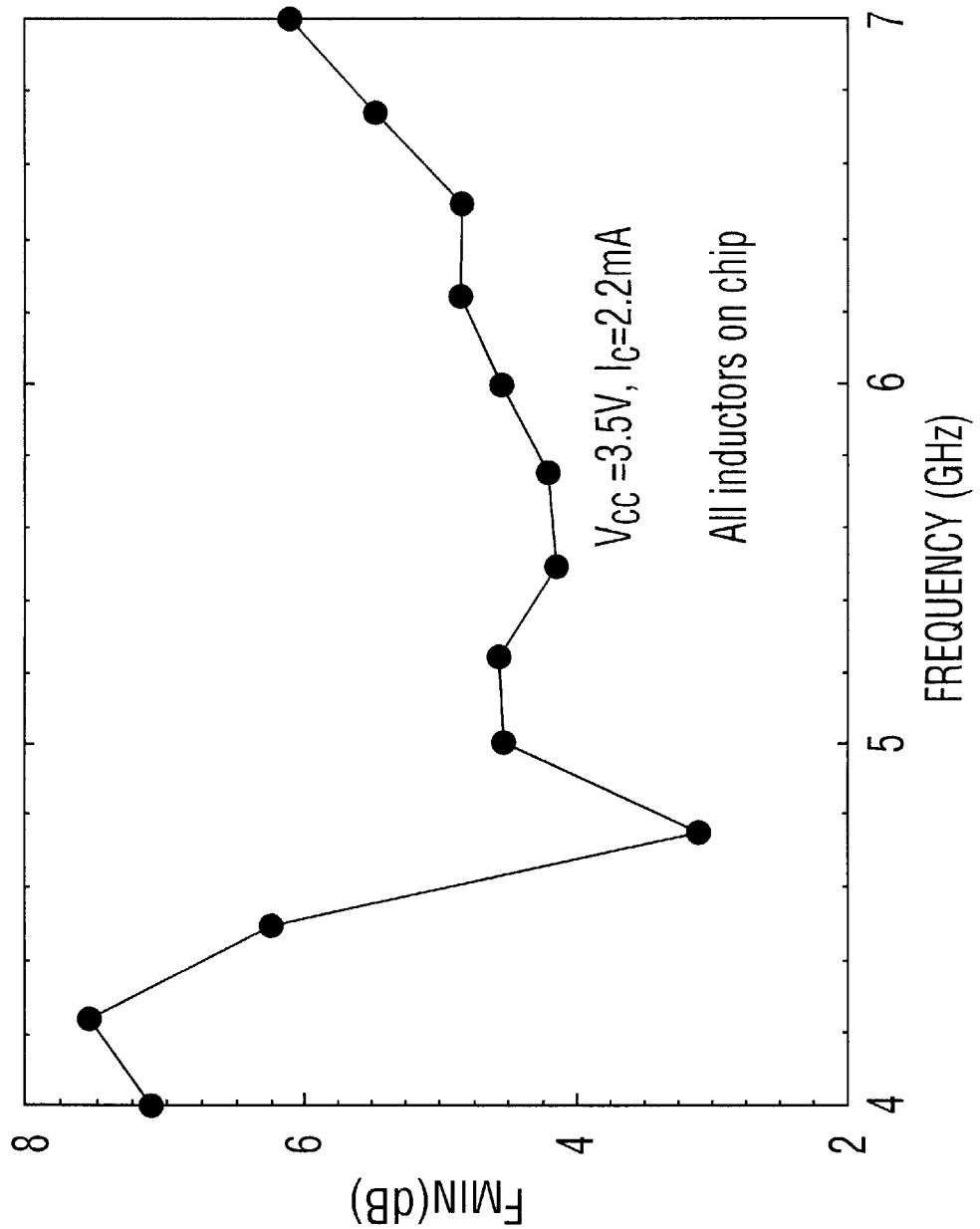
FIG. 13 shows the measured noise figure $F_{MIN}$ as a function of frequency for the low noise amplifier circuit noise and impedance matched for 5.8 GHz.

The measured performance of the LNA and double balanced mixer are summarized in Table 1 for operation at 5.8 GHz. The gain and input return loss of the LNA mixer are shown in FIG. 11 and 12 respectively. The noise figure for the 5.8 GHz LNA is plotted vs. frequency in FIG. 13. The conversion gain of the mixer was measured with a noise figure meter and was confirmed with S parameter measurements with the mixer biased as an amplifier with dc LO inputs only.

TABLE 1

|  | $S_{21}$ | NF | $S_{11}$ | IIP3 | $V_{CC}$ | PD |
|---|---|---|---|---|---|---|
| LNA | 7.2 dB | 4.2 dB | −35 dB | −4 dBm | 3.5V | 7.7 mW |
| Mixer | 21 dB | 4.2 dB | −22 dB | −2 dBm | 3.3V | 26 mW |

The mixer and LNA circuits of the fourth and fifth embodiments were based on silicon bipolar transistors.

Alternatively, these circuits may be implemented using silicon MOSFET transistors. The scalable model for bipolar transistors mentioned above is adaptable to silicon MOSFETs. For silicon MOSFETs, the scalable MISNAN model, developed by Northern Telecom Limited is employed.

Thus analogous MOSFET based circuits similar to those described above, except that the bipolar transistors are replaced with appropriately designed, noise matched silicon MOSFETs. Test measurements on the performance of MOSFET based circuits are not yet available. A sample HSPICE input deck for Silicon MOSFETS is given in Appendix B.

The resulting analytical expressions for the noise parameters of both bipolar and MOSFET devices allow for the design of the transistor geometry to achieve noise matched devices at a given frequency f, and system impedance $Z_0$.

The inventors believe, to the best of their knowledge, that the LNA and mixer circuits described herein are the first fully integrated silicon based mixer and low noise amplifier circuits which have been demonstrated to be operable at 5.8 Ghz, with performance which has previously only been achieved using GaAs based circuits. Moreover, the circuits occupy a record small area for a LNA and a mixer circuit, and provide a factor of at least two in cost reduction relative to a comparable GaAs implementation delivering similar performance.

The noise and impedance matched inductor-transistor structure may also be used for other RF and wireless circuits.

The availability of the scalable models and the analytical noise parameter equations have opened up a new design philosophy for radio frequency (RF) integrated circuits and microwave monolithic integrated circuits (MMICs).

Figure 16:
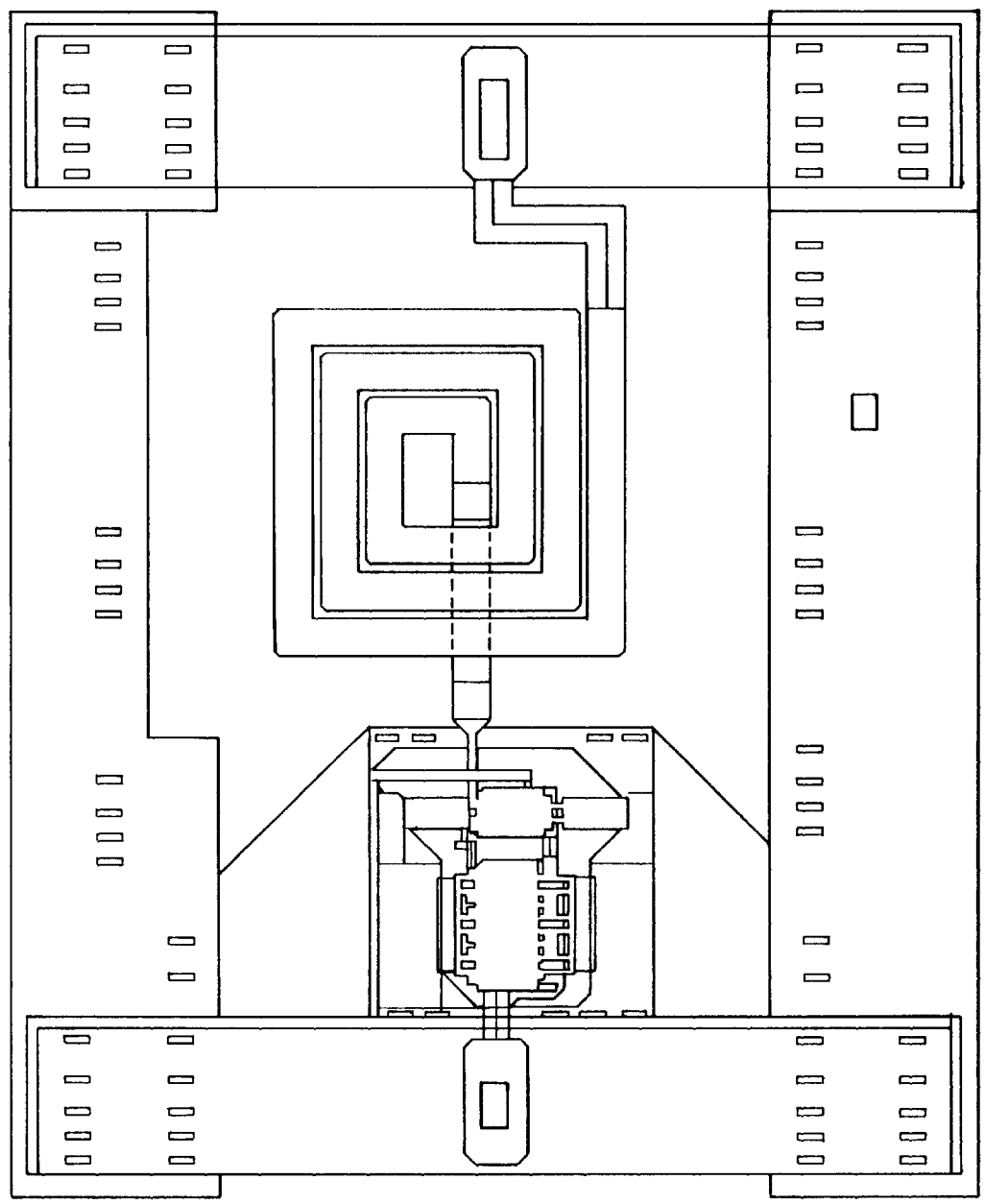
FIG. 16 shows a schematic layout of a gain bandwidth and input impedance optimised Darlington amplifier (16 dB gain at 8 GHz designed using the scalable model, and FIG. 16A shows a photomicrograph of the circuit layout on a reduced scale.
Figure 16A:
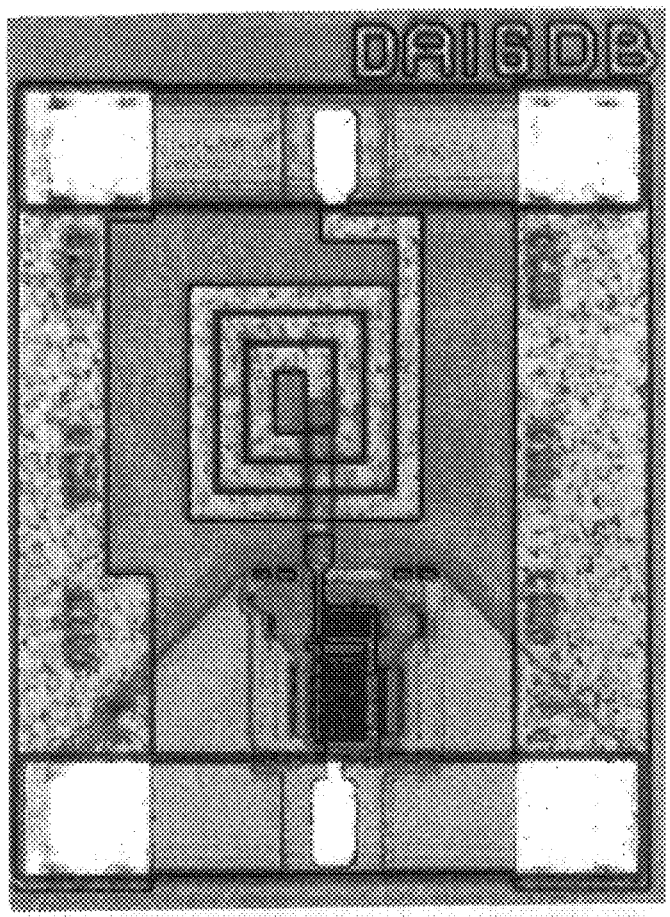
Figure 17A:
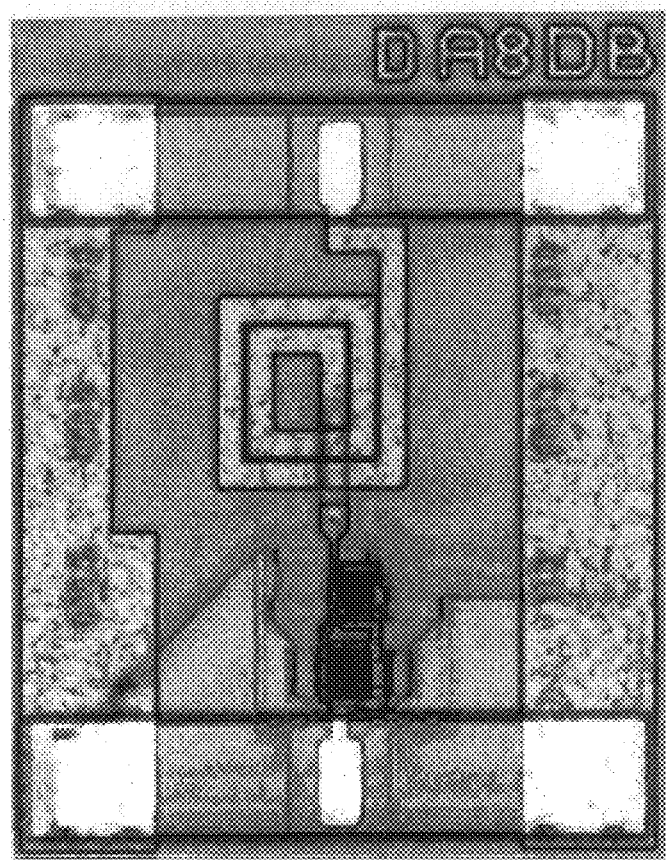
FIG. 17 shows a schematic layout of a noise and impedance optimised Darlington amplifier (8 dB gain at 14 GHz) designed using the scalable model and FIG. 17A shows a photomicrograph of the layout on a reduced scale.
Figure 17:
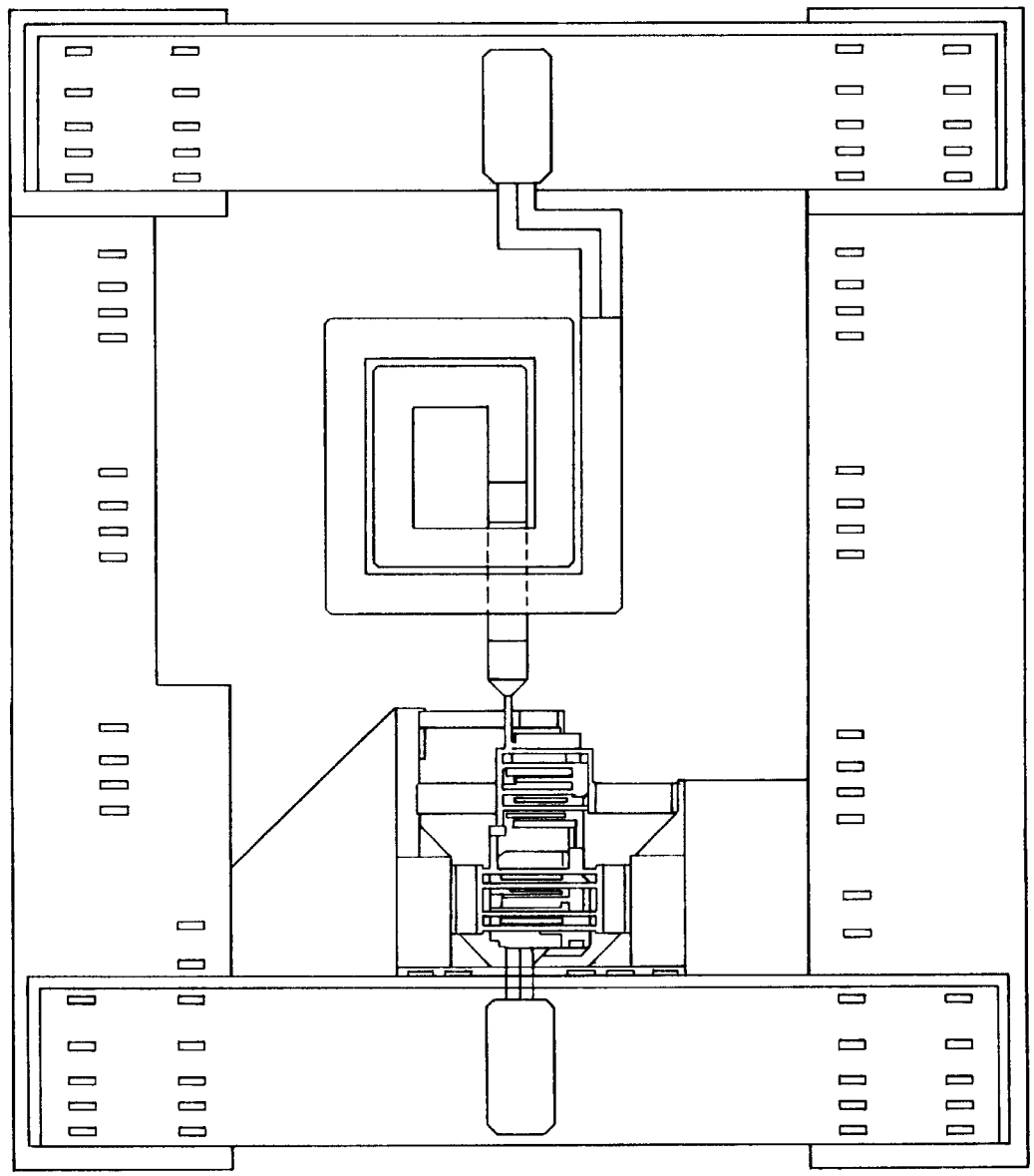

For example, test results showed improved performance when the scalable model was applied to the design of silicon based Darlington amplifiers having 16 dB gain, 7.1 GHz bandwidth and 8 dB gain 12.6 GHz bandwidth, the layouts of which are shown schematically in FIGS. 16 and 17. Corresponding photomicrographs of the chip layout on a reduced scale are shown in FIGS. 16A and 17A. These circuits would have potential applications in broadband optical fiber transmission at 10 Gb/s and 17.5 Gb/s respectively. The size of the output transistor was selected to meet the output compression point specification whereas the input transistor length was optimized to reduce the group delay ripple within the 3 dB bandwidth by adjusting the Q of the resonant circuit associated with the negative resistance of the emitter-follower. The series and shunt feedback resistor values were designed to meet the gain and low frequency input match specification. On-chip input inductors were employed to improve the input return loss at high frequencies. The measured performance is summarized in Table 2.

TABLE 2

| Band | $S_{21}$ | $S_{11}$ | delay | $P_{1dB}$ | $V_{CC}$ | PD |
|---|---|---|---|---|---|---|
| 12.6GHz | 7.8 dB | −30 dB | 8ps | −12dBm | 3.3V | 0.12W |
| 7.1GHz | 16 dB | −22 dB | 8ps | −16dBm | 3.3V | 0.16W |

Figure 18:
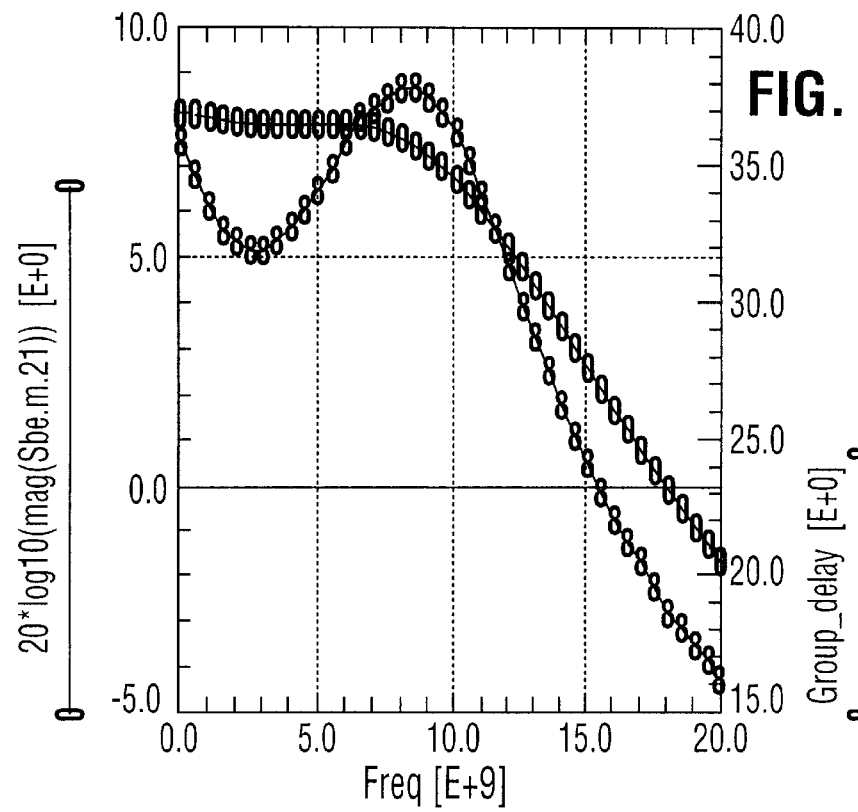
FIG. 18 shows the measured gain and input return loss of a 12.6 GHz bandwidth silicon Darlington amplifier.
Figure 19:
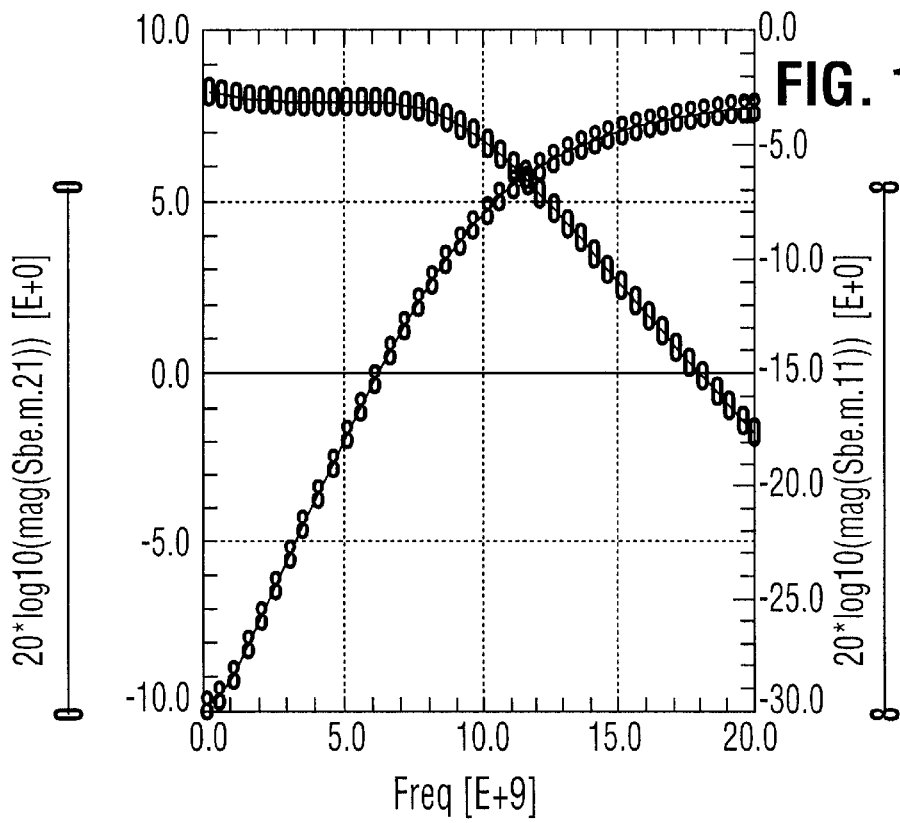
FIG. 19 shows the measured gain and group delay ripple of the 12.6 GHz bandwidth Darlington amplifier.

The gain input return loss and group delay are plotted in FIGS. 18 and 19 as functions of frequency for the 12.6 GHz bandwidth Darlington amplifier. The noise figure of the 7.1 GHz Darlington amplifier is 5.7 dB at 2 GHz increasing to 8.17 dB at 7 GHz. The 12.6 GHz Darlington amplifier has a noise figure of 7.1 dB and 12.5 dB at 2 GHz and 12 GHz respectively.

Gain and bandwidth variation across the wafer for the 8 dB gain amplifier was better than 0.8 dB and 1 GHz respectively.

In summary, the design methodology for the noise and input impedance matched transistor-inductor structure is based on two key features. First, the transistor geometry is treated as a design variable to achieve matching of the real part of the noise impedance of the transistor to the characteristic impedance at the desired frequency, i.e. by adjusting the emitter length or gate width. This approach is in contrast to conventional designs in which the transistor dimensions (size) are treated as fixed parameters. Thus the transistor size is selected initially to suit the application. Second, a minimal passive network is then designed around the noise matched transistor. Again, this contrasts with the conventional approach in which a relative complex passive network is required to provide noise and impedance matching. A conventional matching network is therefore considerably more lossy and occupies a much larger area than the relatively simple matching network resulting from the methodology described herein.

Circuit performance is optimized using fewer components, and the integrated circuit chip area is reduced, both factors being significant cost drivers in integrated circuit manufacturing.

Thus, fabrication of highly cost effective, high performance silicon integrated circuit for RF and wireless applications in the 5 to 6 GHz band is demonstrated to be feasible. The inventors believe that this is a record high frequency for a silicon integrated mixer and LNA circuit circuits. This achievement was made possible only by the used of the design philosophy described herein, together with a high speed silicon bipolar process with integrated inductors.

Improved performance of the circuits is also achieved by the use of the triple level metal process to provide a low loss metal 3 microstrip transmission line structure, using silicon dioxide dielectric, and metal 1 ground planes.

The transistor size for optimal noise match depends on operating frequency and bias current density, whether the circuit is implemented in silicon bipolar technology, i.e. either bipolar junction transistors (BJTs) or Heterojunction bipolar transistors (HBTs); or field effect transistors, MOSFET, MESFET, JFET, HEMT. Sample HSPICE input decks for both bipolar and MOSFET transistors may be adapted for these transistors. The design methodology is particularly applicable to optimising noise and input impedance to reduce losses significantly, and obtain optimal performance in integrated circuits designed in silicon or using heterostructures such as silicon-germanium. Nevertheless, the methodology is also useful in overcoming the trade-off in noise and input impedance matching to improve performance in HBTS, using GaAs, InP and other compound semiconductor integrated circuits.

Furthermore, while simulations based on HSPICE are described in detail, other commercially available or custom design tools may be used.

While specific embodiments have been described in detail, it will be appreciated that variations and modifications to these embodiments may be made within the scope of the following claims.

APPENDICES

APPENDIX A: HSPICE INPUT DECK FOR BIPOLAR TRANSISTORS
Fin(@5.8GHz), fT, fMAX vs log(Ic)
*This Hspice input deck generates .mai output files
*tabulating NF, fT, Fmax, noise resistance NRn, optimum source
*conductance NGop,
*optimum source susceptance Nbop, and S parameters required for associate gain,
*all as functions of the collector current.
*the effect of series parasitics rs, lss, re, le can also be studied.
*three different NT25 transistors are simulated here to investigate noise
*figure scaling.
*reb=RE + RBX + series parasitics.
*1×2(X1.Q) is the collector current
*1/1×16(X1.Q) is the internal base resistance
*tv2=2*VT
*
*For reference: Sorin Voinigescu x34574
*
*
.OPTION nopage autostop search=' '
.OPTION INGOLD=1
*.OPTION ABSVAR=.025 DVDT RELVAR=0.05 NEWTOL
.OPT POST=2   ** hsplot plot format
.OPTIONS DCAP=1
.TEMP=23 TNOM=23
.PARAM  jbase=8e5  vce=1.0
vce   ext_c 0   vce
ibase 0 ext_b ac=1 dc=ibase
.param rs=0.0 1ss=0.0e-11 re=0.0 1e=0.0e-11 cp =0.0e-14
.param emitter_width=unif(0.5u, 0.2)
.param length =10u
x1    c b e e    nt25npn
+      new = emitter_width   nel =length
+      nestripes = 1 nbstripes = 1 ncstripes = 1
+      dtemp = 0
.param area='length*emitter_width' ibase='jbase*area'
* parasitics
rbb    int_b b rs
ree    int_e e re
rcc    int_c c rs
lbb    ext_b int_b lss
lee    int_e 0 le -continued

APPENDICES lcc   ext_c int_c lss
cin ext_b 0 cp
cout ext_c 0 cp
.op
.NET i(vce) ibase    ROUT=50 RIN=50
.ac dec 10 0.1G 60G
*+ SWEEP MONTE =30
+ sweep jbase poi 23    1e5 1.5e5 2e5 3e5 4e5 6e5 7e5 8e5
+ 9e5 1e6  1.5e6 2e6 3e6 4e6 6e6 8e6 1e7 1.5e7  2e7 3e7 4e7 6e7 8e7
*+sweep vce poi 3 1 2 3
*
*+sweep length poi 6 5u 10u 15u 20u 25u 30u
*+sweep emitter_width poi 10 0.3u 0.4u 0.5u 0.6u 0.7u 0.8u 0.9u 1.0u
1.1u 1.2u
*
.param tv2=0.0516
+ reb = '1v2(X1.RE) + LV2(X1.RBX) + rs + re'
+ Rn='reb+1/1×16(X1.Q)+1×2(X1.Q)/tv2/(y21(m)**2)'
+
Gcor='y11(r)*1×2(X1.Q)/((reb+1/1×16(X1.Q))*tv2*(y21(m)**2)+1×2(X1.Q))'
+
Bcor='y11(i)*1×2(X1.Q)/((reb+1/1×16(X1.Q))*tv2*(y21(m)**2)+1×2(X1.Q))'
+Gopt='sqrt(((y11(m)**2)*1×2(X1.Q+(y21(m)**2)*ibase)/(1×2(X1.Q)+tv2*(reb+1v14(X1.Q))*(y21(m)**2))−
(y11(i)*1×2(X1.Q)/((reb+1/1×16(X1.Q))*tv2*(y21(m)2)+1×2(X1.Q)))2)'
+
nfmin-'10*log10(1+2*1×2(X1.Q)/tv2/(y21(m)**2)*(y11(r)+sqrt((1+(reb+1/1×16(X1.Q))*tv2*(y21(m)**2)/1×2(X1.Q))*(y11(m)**2+ibase/1×2(X1.Q)*(y21(m)2))−y11(j)2)))'
.print ac Rn=par('reb+1/1×16(X1.Q)+1×2(X1.Q)/tv2/(y21(m)**2)')
+
Gcor=par('y11(r)*1×2(X1.Q)/((reb+1/1×16(X1.Q))*tv2*(y21(m)**2)+1×2(X1.Q))')
.print ac
+
Gopt=par('sqrt(((y11(m)**2)*1×2(X1.Q+(y21(m)**2)*ibase)/(1×2(X1.Q)+tv2*(reb+1v14(X1.Q))*(y21(m)**2))−
(y11(i)*1×2(X1.Q)/((reb+1/1×16(X1.Q))*tv2*(y21(m)2)+1×2(X1.Q)))2)')
+ Bopt=par('−
y11(i)*1×2(X1.Q)/((reb+1/1×16(X1.Q))*tv2*y21(m)**2+1×2(X1.Q))')
.print ac
+
nfmin=par('10*log10(1+2*1×2(X1.Q)/tv2/(y21(m)**2)*(y11(r)+sqrt((1+(reb+1/1×16(X1.Q))*tv2*(y21(m)**2)/1×2(X1.Q))*(y11(m)**2+ibase/1×2(X1.Q)*(y21(m)2))−y11(i)2)))')
.MEASURE 'ic'    find 1×2(X1.Q)    at 5.8G
.MEASURE 'jc' find par('1×2(X1.Q)*1e-9/area')  at 5.8G
.MEASURE 'one_ic' find par('1/1×2(X1.Q)')  at 5.8G
.MEASURE 'NRn'    find
par('(reb+1/1×16(X1.Q)+1×2(X1.Q)/tv2/(y21(m)**2))/50')    at 5.8G
.MEASURE 'Ngcor'    find
=par('y11(r)*1×2(X1.Q)/((reb+1/1×16(X1.Q))*tv2*(y21(m)**2)+1×2(X1.Q))')
+ at 5.8G
.MEASURE 'Ngop'    find
+
par('sqrt(((y11(m)**2)*1×2(X1.Q+(y21(m)**2)*ibase)/(1×2(X1.Q)+tv2*(reb+1v14(X1.Q))*(y21(m)**2))−
(y11(i)*1×2(X1.Q)/((reb+1/1×16(X1.Q))*tv2*(y21(m)2)+1×2(X1.Q)))2)')
+ at 5.8G
.MEASURE 'Nbop'    find   =par('−
y11(i)*1×2(X1.Q)/((reb+1/1×16(X1.Q))*tv2*(y21(m)**2)+1×2(X1.Q))')
+ at 5.8G
.MEASURE 'NF'
+ find
*
par('10*log10(1+2*1×2(X1.Q)/tv2/(y21(m)**2)*(y11(r)+sqrt((1+(reb+1/1×16(X1.Q))*tv2*(y21(m)**2)/1×2(X1.Q))*(y11(m)**2+ibase/1×2(X1.Q)*(y21(m)2))−y11(i)2)))')
+ at 5.8G
*.MEASURE 'beta'    find   1v10(X1.Q)    at 5.8G
.MEASURE 'ftau2'    find par('h21(m)*2/sqrt(1−(h21(m)/1v10(X1.Q))**2)') at 2G -continued

APPENDICES

```
.MEASURE 'fT'         when h21(db)=0
.MEASURE 'fmax'
+WHEN par('s21(m)*s21(m)/(1-s11(m)*s11(m))/(1-s22(m)*s22(m))')=1
.MEASURE 's11_r'      find s11(r) at 5.8G
.MEASURE 's11_i'      find s11(i) at 5.8G
.MEASURE 's21_r'      find s21(r) at 5.8G
.MEASURE 's21_i'      find s21(i) at 5.8G
.MEASURE 's12_r'      find s12(r) at 5.8G
.MEASURE 's12_i'      find s12(i) at 5.8G
.MEASURE 's22_r'      find s22(r) at 5.8G
.MEASURE 's22_i'      find s22(i) at 5.8G
.LIB
'/bnr/users/bcrks2ef_1/sorinv/ProcessFiles/ta18/technology.nt25.nom'
nom
.inc '/bnr/users/bcrks2ef_1/sorinv/ProcessFiles/ta18/npn.subckt'
*
*.alt
*.LIB
'/bnr/users/bcrks2ef_1/sorinv/ProcessFiles/ta18/technology.nt25.worst'
'worst
*.alt
*.LIB
'/bnr/users/bcrks2ef_1/sorinv/ProcessFiles/ta18/technology.nt25.best'
best
*
.END
APPENDIX B: HSPICE INPUT DECK FOR MOSFET TRANSISTORS
Fmin(@2.5GHz), fT, fMAX vs Ic
*Based on
*G. Dambrine et al., "A New Method for On Wafer Noise Measurement",
* IEEE-MTT, vol. 41, pp. 375–381, 1993.
.OPTION nopage autostop search=' '
.OPTION INGOLD=1
*.OPTION   ABSVAR=.025 DVDT RELVAR=0.05 NEWTOL
.OPT POST=2   ** hsplot plot format
.PARAM       vce=2.5
.NET i(vce) vgs ROUT=50 RIN=50
vce  ext_c 0 vce
vgs  ext_b 0 ac=1  dc=vgs
mft  c b e e  MNCH.0P8
+ L = LL
+ W = WW
+ AD = 5e-11
+ PD = 8.3e-05
+ AS = 5e-11
+ PS = 8.3e-05
* parasitics
.param rs=5  ls=5.0e-11 re=1.0 1e=2.0e-11 cp =0.0e-14
rbb   int_b b rs
ree   int_e e re
rcc   int_c c rs
lbb   ext_b int_b ls
lee   int_e 0 1e
lcc   ext_c int_c ls
cin ext_b 0 cp
cout ext_c 0 cp
.param WW=32e-05 LL=8e-07 vgs=1 p=0.666
.param reb='rs+re' area='WW*LL'
.op
.ac dec 10 0.1G 40G
* t×10 bias
+sweep vgs  0.5 3.5  0.1
*+sweep vce poi 3 1 2 3
.param Rn='reb+p*1×7(mft)/(y21(m)**2)'
.param Gcor='y11(r)*p*1×7(mft)/((reb)*(y21(m)**2)+p*1×7(mft))'
.param Bcor='y11(i)*p*1×7(mft)/((reb)*(y21(m)**2)+p*1×7(mft))'
.param
Gopt='sqrt(((y11(m)**2)*p*1×7(mft))/(p*1×7(mft)+(reb)*(y21(m)**2))–
(y11(i)*p*1×7(mft)/((reb)*(y21(m)**2)+p*1×7(mft)))**2)'
.param
+
nfmin='10*log10(1+2*p*1×7(mft)/(y21(m)**2)*(y11(r)+sqrt((1+
(reb)*(y21(m)**2)/p/1×7(mft))*(y11(m)**2)-y11(i)**2)))'
*print ac Rn=par('reb+p*1×7(mft)/(y21(m)**2)')
+ Gcor=par('y11(r)*p*1×7(mft)/((reb)*(y21(m)**2)+p*1×7(mft))')
*print ac
+
Gopt=par('sqrt(((y11(m)**2)*p*1×7(mft))/(p*1×7(mft)+
(reb)*(y21(m)**2))–(y11(i)*p*1×7(mft)/((reb)*(y21(m)**2)+p*1×
7(mft)))**2)') + Bopt=par('–y11(i)*p*1×7(mft)/((reb)*y21(m)**2+p*1×
7(mft))')
*print ac
+
nfmin=par('10*log10(1+2*p*1×7(mft)/(y21(m)**2)*(y11(r)+sqrt((1+
(reb)*(y21(m)**2)/p/1×7(mft))*(y11(m)**2)-y11(i)**2)))')
.MEASURE 'id'    find 1×4(mft)    at 2.5G
.MEASURE 'jd' find par('1×4(mft)/area')    at 2.5G
.MEASURE 'gm' find par('1×7(mft)')    at 2.5G
.MEASURE 'NRn'    find  par('reb+p*1×7(mft)/(y21(m)**2)')    at
2.5G
.MEASURE 'Ngcor'    find
=par('y11(r)*p*1×7(mft)/((reb)*(y21(m)**2)+p*1×7(mft))')
+ at 2.5G
.MEASURE 'Ngop'    find
+ par('sqrt(((y11(m)**2)*p*1×7(mft))/(p*1×7(mft)+
(reb)*(y21(m)**2))–(y11(i)*p*1×7(mft)/((reb)*(y21(m)**2)+p*1×
7(mft)))**2)')+ at 2.5G
.MEASURE 'Nbop'    find    =par('–
y11(i)*p*1×7(mft)/((reb)*(y21(m)**2)+p*1×7(mft))')
+ at 2.5G
.MEASURE 'NF'
+ find
+
par('10*log10(1+2*p*1×7(mft)/(y21(m)**2)*(y11(r)+sqrt((1+
(reb)*(y21(m)**2)/p/1×7(mft))*(y11(m)**2)-y11(i)**2)))')
+ at 2.5G
.MEASURE 'fT'    when h21(db)=0
.MEASURE 'fmax'
+WHEN par('s21(m)*s21(m)/(1-s11(m)*s11(m))/(1-s22(m)*s22(m))')=1
.MEASURE 's11_r'    find s11(r) at 2.5G
.MEASURE 's11_i'    find s11(i) at 2.5G
.MEASURE 'm_s21'    find s21(m) at 2.5G
*
*
.LIB '/bnr/ntcad.alpha/tech/nte/batmos/DK/hspice/nmos' TYPICAL
.END
```

What is claimed is:

1. A method for providing a noise and impedance matched integrated circuit comprising an integrated transistor inductor structure, comprising:

first, determining the geometric dimensions of the transistor to provide the real part of the noise impedance of the transistor equal to the characteristic impedance $Z_0$ at a desired frequency and collector current density, to achieve noise matching;

and then, designing a minimal passive matching circuit comprising a first inductor to provide matching of the real part of the input impedance and a second inductor cancelling out the noise reactance and input impedance reactance of the structure.

2. A method according to claim 1 wherein the transistor has a characteristic dimension, the characteristic dimension being an emitter length $l_E$ for a bipolar transistor and a gate width $w_g$ for field effect transistor, and comprising selecting the characteristic dimension of the transistor to provide that the real part of its optimum noise impedance is equal to the characteristic impedance of the system, $Z_0$.

3. A method according to claim 2 wherein the steps of designing a noise matched transistor comprise:

determining an optimal noise current density $J_{Q1}$ according to the equation:

$$F_{MIN} = 1 + \frac{I_C}{V_T |Y_{21}|^2}\left(\text{Re}\{Y_{11}\} + \right.$$

-continued $$\sqrt{\left[1+\frac{2V_T|Y_{21}|^2(r_E+r_B)}{I_C}\right]\left[|Y_{11}|^2+\frac{I_B|Y_{21}|^2}{I_C}\right]-(\text{Im}\{Y_{11}\})^2}$$

and then determining the optimized emitter length $l_E$, by running a simulation using a scalable model to bias the transistor at the optimal noise density and adjusting $l_E$ until $R_{SOP}$ ($I_E$)=$Z_0$ the characteristic impedance of the circuit, where, $$R_{sop} \cong \frac{R_n f_T}{f} \frac{\sqrt{\frac{I_C}{2V_T}(r_E+r_B)\left(1+\frac{f_T^2}{\beta_0 f^2}\right)+\frac{n^2 f_T^2}{4\beta_0 f^2}}}{\frac{I_C}{2V_T}(r_E+r_B)\left(1+\frac{f_T^2}{\beta_0 f^2}\right)+\frac{n^2}{4}\left(1+\frac{f_T^2}{\beta_0 f^2}\right)} = Z_0$$

thereby determining the transistor size and bias current.

4. A method according to claim 3 comprising determining the optimal noise current density by using $F_{MIN}$ vs log($I_c$) curves.

5. A method according to claim 3 wherein the method steps of claim 3 are carried out using an HSPICE simulation.

6. A method according to claim 5 wherein the transistor is a bipolar transistor and the HSPICE input deck is defined as in appendix A.

7. A method according to claim 5 wherein the transistor is a MOSFET transistor and the HSPICE input deck is defined as in appendix B.

8. A method according to claim 1 wherein the transistor is a bipolar transistor and the steps of designing a minimal passive impedance matching circuit comprising first and second inductors, comprises:

determining the inductance of an emitter inductor $L_E$ to match the real part of the input impedance to $Z_0$ and then, determining the inductance of a base inductor $L_B$ to simultaneously match the imaginary part of the input impedance and the noise impedance to 0Ω.

9. A method according to claim 8 comprising providing a first inductor having a value $L_E=Z_0/\omega_T$, where $\omega_T$ is operational frequency and a second inductor having a value $L_B=1/\omega^2 C_{in}-L_E$, wherein $C_{in}$ is the total input capacitance of the transistor.

* * * * *